United States Patent
Carberry

(10) Patent No.: US 9,620,664 B2
(45) Date of Patent: Apr. 11, 2017

(54) COATING OF GRAPHITE TOOLING FOR MANUFACTURE OF SEMICONDUCTORS

(71) Applicant: Mossey Creek Technologies Inc., Jefferson City, TN (US)

(72) Inventor: John Carberry, Talbott, TN (US)

(73) Assignee: Mossey Creek Technologies, Inc., Jefferson City, TN (US)

( * ) Notice: Subject to any disclaimer, the term of this patent is extended or adjusted under 35 U.S.C. 154(b) by 0 days.

(21) Appl. No.: 14/482,575

(22) Filed: Sep. 10, 2014

(65) Prior Publication Data

US 2015/0069213 A1    Mar. 12, 2015

Related U.S. Application Data

(60) Provisional application No. 61/877,020, filed on Sep. 12, 2013.

(51) Int. Cl.

| H01L 31/18 | (2006.01) |
|---|---|
| C30B 29/34 | (2006.01) |
| B05D 5/12 | (2006.01) |
| C30B 29/06 | (2006.01) |
| B05D 1/12 | (2006.01) |

(Continued)

(52) U.S. Cl.
CPC .............. *H01L 31/18* (2013.01); *B05D 1/12* (2013.01); *B05D 3/0281* (2013.01); *B05D 5/12* (2013.01); *C30B 29/06* (2013.01); *C30B 29/34* (2013.01); *C30B 33/02* (2013.01); *C30B 35/002* (2013.01); *H01L 21/67* (2013.01); *H01L 21/673* (2013.01); *H01L 21/67005* (2013.01); *H01L 21/67098* (2013.01); *H01L 21/67115* (2013.01); *H01L 21/67121* (2013.01); *H01L 31/182* (2013.01); *H01L 31/1804* (2013.01); *H01L 31/1824* (2013.01); *H01L 31/20* (2013.01); *H01L 31/202* (2013.01); *H01L 31/208* (2013.01)

(58) Field of Classification Search
CPC .............. H01L 21/67; H01L 21/67005; H01L 21/67098; H01L 21/67013; H01L 21/67115; H01L 21/67121; H01L 21/673; H01L 31/18; H01L 31/1804; H01L 31/182; H01L 31/1824; H01L 31/20; H01L 31/202; H01L 31/208; C30B 29/06; C30B 29/34; C30B 33/02; C30B 35/002; C23C 24/00; C23C 24/08; B05D 1/12; B05D 3/0281; B05D 5/12
USPC ....... 427/532, 591, 543, 133, 135, 180, 181, 427/189, 190, 204, 372.2, 376.2; 249/114.1; 264/85, 104, 405
See application file for complete search history.

(56) References Cited

U.S. PATENT DOCUMENTS

| 4,624,862 A | 11/1986 | Yang et al. |
|---|---|---|
| 4,803,183 A | 2/1989 | Schwetz et al. |

(Continued)

FOREIGN PATENT DOCUMENTS

| CN | 101244823 | | 8/2008 |
|---|---|---|---|
| CN | 102351189 A | * | 2/2015 |
| JP | 11021805 | | 1/1999 |

*Primary Examiner* — William Phillip Fletcher, III
(74) *Attorney, Agent, or Firm* — Pitts & Lake, P.C.

(57) ABSTRACT

A tool useful in the manufacture of a semiconductor is disclosed. A mold is providing having an interior defining a planar capillary space. A coating substantially covers at least the planar capillary space of the graphite member. The coating is substantially non-reactive to silicon at temperatures greater than approximately 1420 degrees Centigrade.

8 Claims, 13 Drawing Sheets

(51) Int. Cl.
  *B05D 3/02* (2006.01)
  *C30B 33/02* (2006.01)
  *H01L 31/20* (2006.01)
  *H01L 21/67* (2006.01)
  *H01L 21/673* (2006.01)
  *C30B 35/00* (2006.01)

(56) References Cited

U.S. PATENT DOCUMENTS

| | | | |
|---|---|---|---|
| 4,877,759 A | 10/1989 | Holt et al. | |
| 4,908,173 A | 3/1990 | Schwetz et al. | |
| 5,049,367 A | 9/1991 | Nakano et al. | |
| 5,165,983 A | 11/1992 | Sugiura et al. | |
| 5,427,601 A | 6/1995 | Harada et al. | |
| 5,431,869 A | 7/1995 | Kumar et al. | |
| 5,496,416 A | 3/1996 | Hall et al. | |
| 5,654,246 A | 8/1997 | Newkirk et al. | |
| 6,013,236 A | 1/2000 | Takahashi et al. | |
| 6,902,699 B2 | 6/2005 | Fritzemeier et al. | |
| 7,344,675 B2 | 3/2008 | Van Daam et al. | |
| 7,354,490 B2 | 4/2008 | Fritzemeier et al. | |
| 7,604,696 B2 | 10/2009 | Carberry | |
| 7,682,472 B2 | 3/2010 | Kaneko | |
| 7,908,173 B1 | 3/2011 | Hill | |
| 7,922,841 B2 | 4/2011 | Bampton et al. | |
| 8,765,036 B2 * | 7/2014 | Carberry | B29C 35/0805 264/104 |
| 8,828,791 B2 | 9/2014 | Carberry | |
| 2002/0125402 A1 | 9/2002 | Cordes et al. | |
| 2004/0048411 A1 | 3/2004 | Nishida | |
| 2004/0055909 A1 | 3/2004 | Gamberi et al. | |
| 2005/0052388 A1 | 3/2005 | Handschy et al. | |
| 2005/0145176 A1 | 7/2005 | Wicker | |
| 2006/0057317 A1 * | 3/2006 | Shimizu et al. | 428/34.5 |
| 2006/0107769 A1 | 5/2006 | Emoto | |
| 2006/0142143 A1 | 6/2006 | Abrevaya et al. | |
| 2006/0162766 A1 | 7/2006 | Gee et al. | |
| 2008/0110491 A1 | 5/2008 | Buller et al. | |
| 2008/0142956 A1 | 6/2008 | Cambou et al. | |
| 2008/0153688 A1 | 6/2008 | Borens et al. | |
| 2010/0133415 A1 * | 6/2010 | Tronstad | C30B 11/002 249/114.1 |
| 2011/0135902 A1 * | 6/2011 | Mazumder et al. | 428/220 |

* cited by examiner

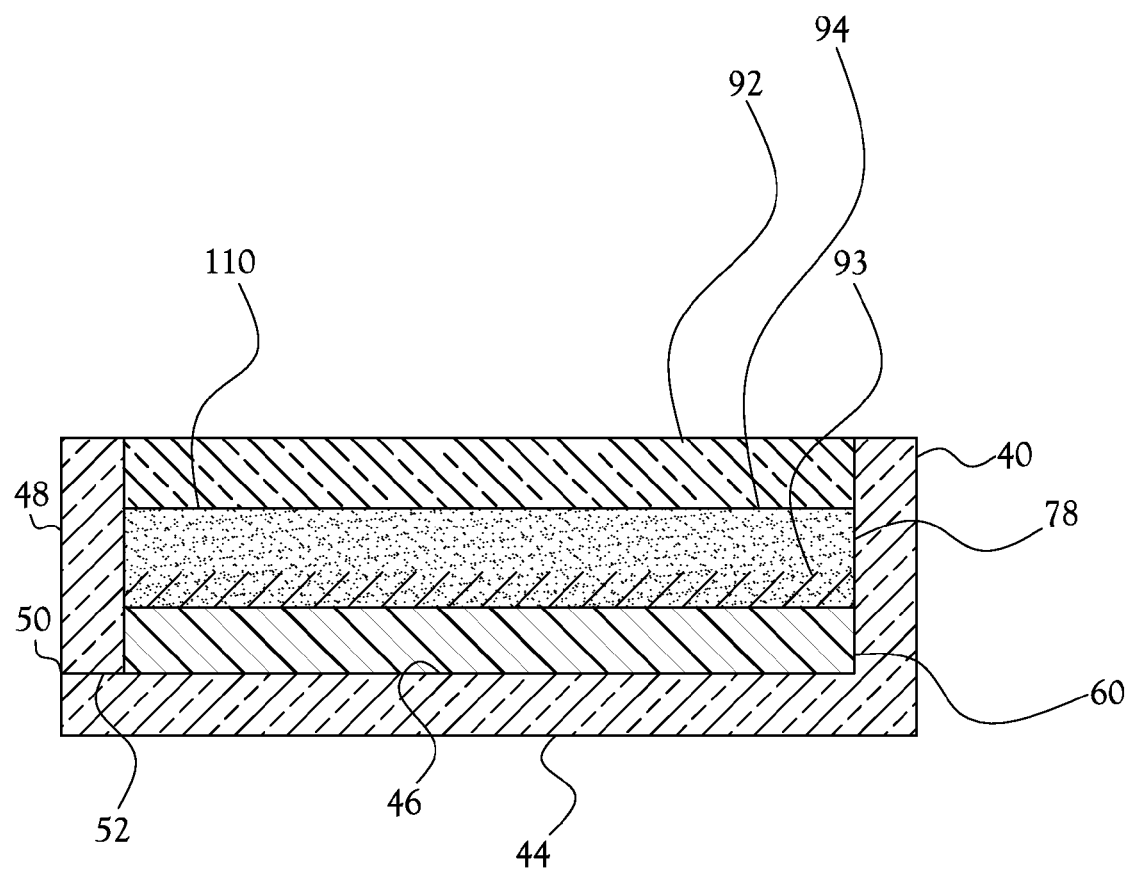
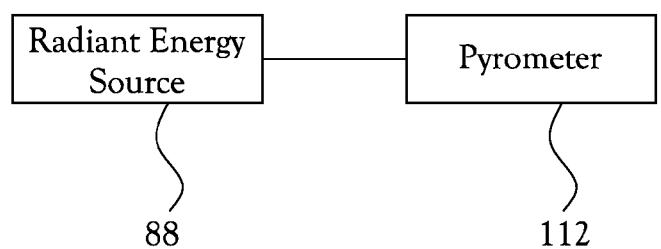
Fig.6

COATING OF GRAPHITE TOOLING FOR MANUFACTURE OF SEMICONDUCTORS

CROSS-REFERENCE TO RELATED APPLICATIONS

This application claims benefit of U.S. Provisional Patent Application No. 61/877,020, filed on Sep. 12, 2013; and is a continuation-in-part of U.S. patent application Ser. No. 14/253,514, filed on Apr. 15, 2014; which is a continuation-in-part of U.S. patent application Ser. No. 13/236,391, filed Sep. 19, 2011, now U.S. Pat. No. 8,765,036 B2; which claims benefit of U.S. Provisional Patent Application No. 61/347,904, filed May 25, 2010; U.S. Provisional Patent Application No. 61/406,755, filed on Oct. 26, 2010; U.S. Provisional Patent Application No. 61/442,016, filed on Feb. 11, 2011; International Patent Application No. PCT/US2011/037899, filed on May 25, 2011; and International Patent Application No. PCT/US2011/037900, filed May 25, 2011. Each of the foregoing applications is incorporated in its entirety herein by reference.

STATEMENT REGARDING FEDERALLY SPONSORED RESEARCH OR DEVELOPMENT

Not Applicable

BACKGROUND OF THE INVENTION

1. Field of Invention

The present general inventive concept pertains to semiconductor production, and more particularly, to a graphite tool useful in a method of producing a low cost, high-efficiency, high yield semiconductor, the graphite tool having a coating thereon to assist in the manufacture of such semiconductors.

2. Description of the Related Art

The use of silicon and aluminum as precursors for making a variety of semiconductor members for use in products such as solar cells, light-emitting diodes, high energy energetic materials, and other semiconductor and ceramic applications, requires that such precursors be free of contamination with materials and elements with which these materials are naturally very reactive, such as oxygen, carbon, nitrogen, and iron. Such contamination often creates undesirable effects in the resultant semiconductor member, such as low thermal conductivity, low electrical output, low strength, poor kinetics, and poor energy output or reactivity. Because the bonds created by such contaminations are typically covalent bonds, such contaminants are difficult to remove once they have joined with the precursor. In many cases, the contaminant itself is difficult to measure and the negative effects created by the contaminant, though understood and recognized, are difficult to quantify.

As an example, in the manufacture of photovoltaic cells, commonly known as "solar cells," generally the solar cells are fabricated using a semiconductor wafer substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to a conductor on the solar cell to direct an electrical current from the cell to an external circuit coupled thereto. Commonly, the semiconductor wafer substrate is a silicon wafer, with the n-type junction on the surface of the silicon wafer based on phosphorous doping and the p-type junction in the body of the silicon wafer based on boron doping.

In terms of desirability for producing a low cost, high-efficiency, high yield semiconductor useful in manufacturing solar cells, it is recognized that use of solar cells in electrical energy production is attractive, in part due to the inexpensive nature of solar radiation used to fuel energy production in the solar cells. As the fuel costs associated with more conventional means of electrical energy production increase, demand for solar cells for electrical energy production also increases. However, previous methods for production of semiconductors useful in manufacturing solar cells have proven to be labor intensive, energy intensive, and materials intensive, and such previous methods have often resulted in the production of solar cells having relatively low efficiency in electrical energy production. For example, in one known method of producing a solar grade semiconductor wafer, a polycrystalline silicon material is used as the substrate. In this method, the polycrystalline silicon wafer is obtained by first placing and packing essentially pure lumps of silicon in a crucible. The crucible is loaded into a vacuum furnace that has heating elements made of graphite. The vacuum furnace heats the silicon lumps, causing them to melt. Thereafter, the melted silicon is cooled to encourage the formation of a large silicon ingot defining polycrystalline crystal formations. The crucible is commonly constructed of fused silica and, because of the processing temperature of the vacuum furnace, the fused silica partially converts to crystobalite during the melting process within the vacuum furnace. Thus, the crucible is a single use and expensive tool. The melting process also produces a polycrystalline silicon ingot having a large outer volume contaminated by impurities reacted with the melted silicon. This outer volume is cut away and discarded following manufacture of the polycrystalline ingot. Thereafter, the somewhat more pure remaining inner portion of the ingot is thin-cut into discreet polycrystalline silicon wafers using a wire saw in a diamond slurry, causing a very large additional loss of silicon, and also limiting the minimum thickness the wafer can be fabricated. The resultant polycrystalline silicon wafers can then be laminated to a conductive layer, thereby forming the solar cell as described above.

The length of the heating-cooling cycle in the above-described method is often 45-60 hours. Thus, the time associated with performing the above-described heating-cooling cycle can result in significant delays in the production process. One factor in determining the length of the heating-cooling cycle is the time required to heat the silicon feedstock sufficiently to cause it to melt. As a general rule, the smaller the initial lumps of silicon to be melted, the faster the heating and melting cycle. However, it has been found that the process of diminution of the silicon lumps into silicon granules often smears undesirable contaminants onto the surface of the resulting silicon granules. Thus, the silicon lumps used are typically very coarse, having an average size of approximately thirty (30) millimeters. Use of such coarse materials helps to preserve purity in the melted silicon. However, the packing density of the above-discussed silicon lumps in the mold is approximately thirty-five (35) percent of perfect packing, which is significantly less than ideal. Consequently, heat is not conducted efficiently through such a feedstock, and additional heating time is required. Given that (1) the heating elements are on the outside of the crucible, (2) the silicon lumps have relatively little physical contact with one another, and (3) the silicon lumps often serve to "shadow" one another from thermal radiation very heavily; most of the heating occurs by thermal radiation that is accomplished in succession, wherein a relatively exposed silicon lump is heated, and that lump then radiates heat to one or more successive relatively unexposed lumps, i.e., one or more of the silicon lumps that are "shadowed." In many instances, a partial pressure of argon gas is used to assist in transferring heat to the silicon feedstock.

The above-discussed process of melting the silicon material often results in undesirable random crystal structures present in the silicon ingot, contributing to poor performance of the semiconductor polycrystalline silicon wafer. For example, in use of the polycrystalline silicon wafer for the manufacture of solar cells, such random crystal structures often result in a low efficiency in the resulting polycrystalline silicon wafer for converting sunlight into electrical energy. Furthermore, during the heating and subsequent cooling of the silicon, two impurities, i.e., silicon carbide (SiC) and dissolved oxygen complexes (including silicon-oxygen complexes), are produced in the silicon feedstock. These impurities cause a reduction in the yield of usable silicon crystal wafers that can be as high as approximately forty (40) percent. Also, these impurities cause additional defects in the crystal structure that further reduce the efficiency and life of the semiconductor polycrystalline silicon wafer.

At least a few factors encourage the synthesis of these impurities. First, the high temperatures achieved in the furnace promote the oxidation of its graphite heating elements by reduction of the fused silica with which the graphite is in physical contact, thus creating a partial pressure of CO and $CO_2$. Other components of the vacuum furnace may be composed of graphite as well, including the insulation material, and likewise, may too be oxidized. This oxidation-reduction reaction commonly yields two gases: carbon monoxide (CO) and carbon dioxide ($CO_2$). These gases then react with the silicon feedstock in the mold to yield silicon carbide and dissolved-oxygen complexes. Second, although rebonded fused silica is a highly refractory substance, it is permeable by carbon oxide gases (e.g., CO and $CO_2$). Thus, carbon oxide gases access the silicon feedstock by permeating the mold. Third, the packing density of the silicon lumps results in spaces that can be permeated and/or occupied by the carbon oxide gases. The surfaces of the silicon lumps that border these spaces serve as additional loci for the oxidation-reduction reaction that yields silicon carbide and dissolved-oxygen complexes. It has further been found that, in the above-referenced polycrystalline silicon production process, the melted silicon within the crucible contains approximately 350 ppm iron oxide (Fe2O3) in solution. At temperatures between approximately 1,100 and 1,600 degrees Centigrade of the melted silicon, crystobalite crystals precipitate within the melted silicon, thereby forcing the iron oxide into the grain boundaries of the silicon as the viscosity of the silicon lowers. Such iron oxide contaminants significantly reduce the carrier life time and efficiency of the resultant polycrystalline silicon wafer.

If a silicon wafer body is uniformly doped at low levels with phosphorous, use of boron to dope the surface of the silicon wafer to establish a p-type junction results in greatly increased efficiency in converting photons to electrons by the resultant solar cell. However, prior art doping technology makes this type of uniform doping of phosphorous in a solar grade silicon wafer impractical in a commercial setting. Specifically, because of the process time of the vacuum furnace and the size of the melted silicon ingot, it is impractical to directly "dope" the melted silicon ingot to form the body of the n-type or p-type junction. Because of the limits of the doping technology, doping of the silicon is generally limited to using boron in the body of the silicon wafer to make the p-type junction and phosphorous at the surface of the silicon wafer to make the n-type junction. However, the methods of applying phosphorous to the surface of the silicon result in much larger coatings than are needed or can be achieved with boron. Finally, it must be acknowledged that vacuum furnaces generally do not create perfect vacuums, allowing atmospheric gases and potentially other gases to enter. Atmospheric gases include oxidizing agents that, as described previously, can result in the production of impurities.

A further yield loss is incurred by the sawing and slicing of the billet into wafers. Polycrystalline silicon is a relatively hard and brittle material, and thus, the operation of cutting the polycrystalline material is inherently difficult and labor intensive and results in a high mortality rate of the thin-cut silicon wafers due to fracture of the wafers during tooling and handling. In at least some instances, by the time the above-discussed contaminated outer layer is removed from the silicon ingot and the ingot is sliced down to silicon wafers having a thickness of approximately 150-200 microns, and by the time resultant fractured wafers are discarded, the yield of usable thin-cut silicon wafers on starting silicon can be as low as 10-30%.

In use of silicon semiconductor wafers in the manufacture of solar cells, while a silicon wafer of approximately 180 microns in thickness captures substantially all sunlight, a silicon wafer of approximately 40 microns still captures most sunlight, i.e., in excess of 96% of sunlight in normal conditions. The slight loss of light capture of the 40 micron wafer is more than compensated for in efficiency increases by decreased instances of recombination associated with a shorter path through the 40 micron silicon wafer. Thus, it is believed that a thinner wafer, perhaps 40 microns thick, would be optimal for use in solar cells. However, such a wafer cannot be made and handled by prior existing technology absent significant breakage of the wafer as discussed above. In light of the above, the low yield of usable silicon wafer material and the high costs per unit of solar conversion efficiency associated with manufacture of solar cells using the above-discussed process have made use of solar cells manufactured by the above-discussed process for electrical energy production in the residential, commercial, and utility sectors impractical in many applications from an economical point of view without large subsidies from governments and the like.

U.S. Pat. No. 7,604,696 ("the '696 patent), which was issued to Carberry, describes one method of converting a silicon powder slurry into thinly molded solar grade silicon wafer. However, this and other known methods often lead to increased contamination of the resultant silicon wafers during the heating and cooling cycle. Accordingly, there is a continuing need for an improved method to produce a high-efficiency, solar cell.

Other uses for semiconductor members include the manufacture of light-emitting diodes ("LED's"). It is known that the lifetime of a semiconductor used in an LED is largely defined by its operating temperature. Specifically, the lower the operating temperature, the lower the rate of diffusion among the various thin layers of materials which enable the function of the semiconductor, such diffusion being the eventual failure mode of most semiconductors. Thus, high-purity aluminum nitride, which has a high thermal conductivity and a coefficient of thermal expansion similar to silicon, has been found to be beneficial in for use as a semiconductor in the manufacture of LED's. However, aluminum nitride of sufficient purity to achieve the requisite high thermal conductivity has traditionally suffered from a prohibitively high manufacture cost.

Two prior art processes for manufacturing aluminum nitride, carbo-thermal reduction and direct nitridation, each suffer from poor precursors and multiple processes that make it impossible to achieve low cost and low oxygen content of the aluminum nitride product. Aluminum precursors are commonly available in two forms, nanophase precursors and milled aluminum. Particles comprising a nanophase precursor have too high a surface area and too small a size to be easily useful for fabricating ceramic preforms directly. Milled aluminum is commonly available in five micron thick ribbons which are also difficult to work with in classic forming technologies for making ceramic performs. In both nanophase precursors and milled aluminum, and with both the nitriding and carbo-thermic reduction processes, the oxygen content of the finished aluminum nitride is too high to achieve sufficient purity of the aluminum nitride product for beneficial use in an LED. Likewise, silicon nitride suffers in its performance as a semiconductor largely from iron in the grain boundaries of the silicon nitride, which can only be eliminated by having a silicon powder sufficiently free of oxygen and iron as discussed above.

In light of the above, it is desirable to develop a method for manufacturing semiconductor members in which precursors are produced having a high surface area, nearly equaxed morphology, and low presence of contaminants such as oxygen, iron, nitrogen, carbon, and the like, and that such precursors have a particle size and particle size distribution suitable for forming and processing from an unoxidized, uncontaminated state. It is further desirable that the method allow for manufacture of the semiconductor member while maintaining a heightened purity of the precursors, thus producing a high-purity finished semiconductor product.

BRIEF SUMMARY OF THE INVENTION

The present general inventive concept provides tooling useful in a method of producing a semiconductor having a heightened purity of the semiconductor materials. The tooling further allows for the production of a semiconductor with reduced waste of precursor feedstock as compared with certain prior art methods. Example embodiments of the present general inventive concept can also be achieved by providing a mold defining a planar capillary space, the mold having a coating thereon that is substantially non-reactive to silicon. Example embodiments of the present general inventive concept can also be achieved by using a mold which is fabricated from a material capable of being quickly heated by inductive heating. For example, in certain embodiments, the mold is fabricated from graphite. In more discreet embodiments, at least the interior of the graphite mold is covered with a material that is substantially non-reactive to silicon powder. In one embodiment, the non-reactive material coating the mold is silicon nitride. One embodiment of the present general inventive concept can be achieved by providing a measure of finely divided silicon nitride containing less than 2% silica, oxygen, and silicon; mixing the silicon nitride with colloidal silica; coating the graphite mold with the silicon nitride and colloidal silica mixture; and heating the coating in the presence of nitrogen to a temperature in excess of 1,400 degrees Centigrade to form a silicon nitride covering on the mold.

BRIEF DESCRIPTION OF THE SEVERAL VIEWS OF THE DRAWINGS

The above-mentioned and other features of the invention will become more clearly understood from the following detailed description of the invention read together with the drawings in which:

FIG. 6 is a cross-sectional view of the mold of FIG. 5, showing the finished semiconductor following heating and cooling of the mold components;

DESCRIPTION OF THE INVENTION

Figure 1:
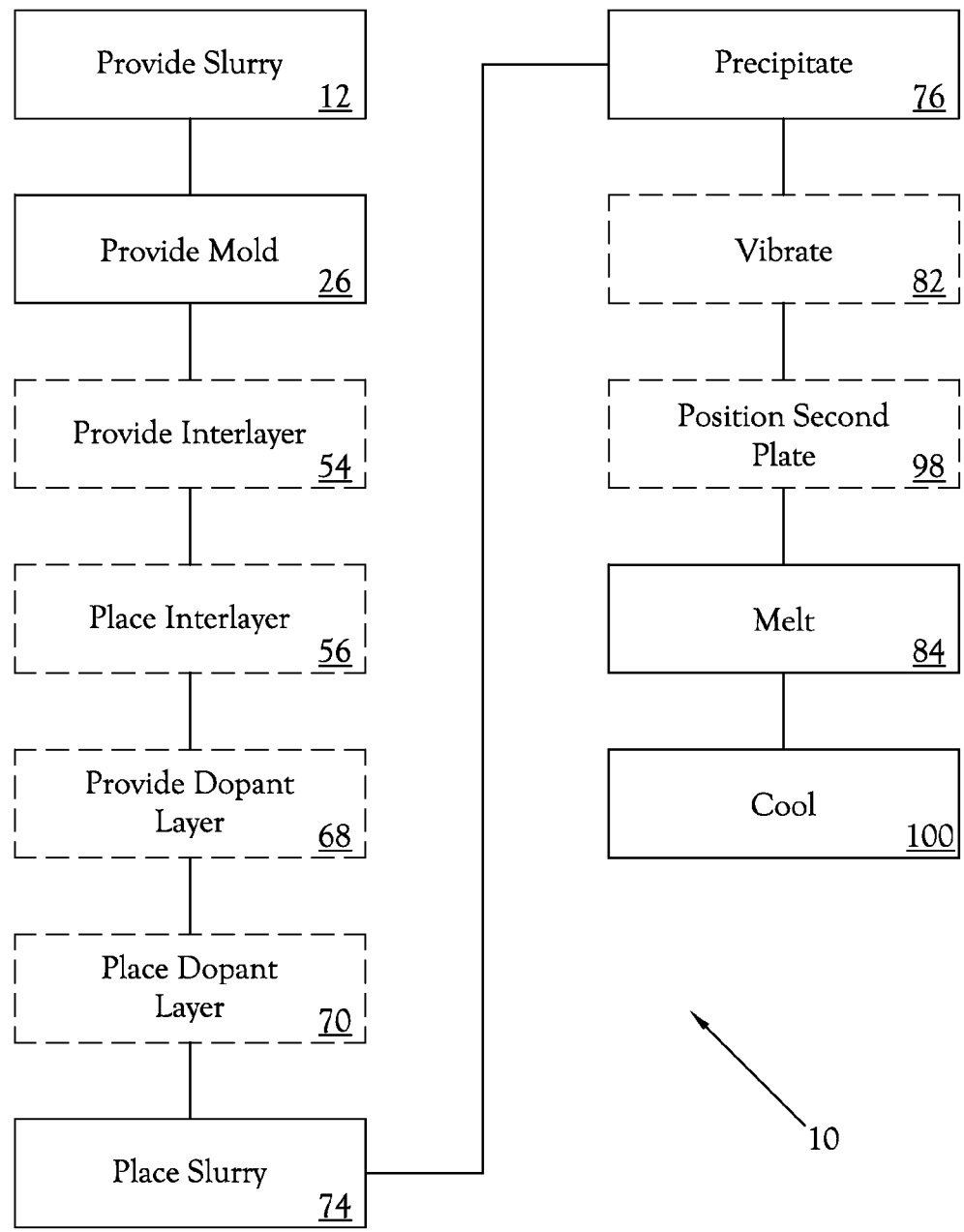
FIG. 1 is a flowchart showing one embodiment of the method of producing a semiconductor of the present invention.

A method of producing a semiconductor is disclosed herein and in the accompanying Figures. FIG. 1 is a flowchart that shows one embodiment of the method of producing a semiconductor, or "method" 10. As shown in FIG. 1, in one embodiment the method 10 includes an operation of providing an amount of slurry 12 which is comprised of a semiconductor precursor powder that is essentially free of oxides and other undesirable impurities and a liquid cover that limits, and preferably essentially prevents, the oxidation of the precursor powder. In several embodiments, the precursor is selected from the group consisting of substantially pure silicon, substantially pure aluminum, and a combination thereof. In more discreet embodiments, the precursor is doped by alloying the precursor with materials desired in the finished semiconductor material. In one embodiment, the precursor powder component of the slurry consists essentially of particles having an average size of less than, or equal to, approximately twelve (12) microns. The advantages of this particle size are described later in this specification. In one embodiment of the present invention, the liquid cover component of the slurry prevents or nearly prevents the oxidation of the precursor powder. Accordingly, in embodiments in which the precursor powder includes silicon, the synthesis of silicon carbides (e.g., SiC) is discouraged.

It will be understood that, when melting the precursor powder to form a semiconductor, a higher temperature is required to melt the precursor powder than to sinter the precursor powder. It will further be understood that, in embodiments in which the precursor powder includes silicon, sintering the precursor powder encourages the oxidation-reduction reaction that yields both silicon carbide and the dissolved-oxygen complexes, including silicon-oxygen complexes. Thus, the absence or near absence of oxides (e.g., silica ($SiO_2$)) and other harmful impurities in or on the silicon powder promotes melting rather than sintering of the silicon. It will also be understood that the liquid cover, when combined with the precursor powder and removed just prior to melting as discussed below, protects the precursor from absorbing other gasses, including nitrogen and oxygen, which in the case of a finely divided silicon powder limits contamination of the silicon that has been shown to limit efficiency in other applications of melting silicon powders.

Figure 2:
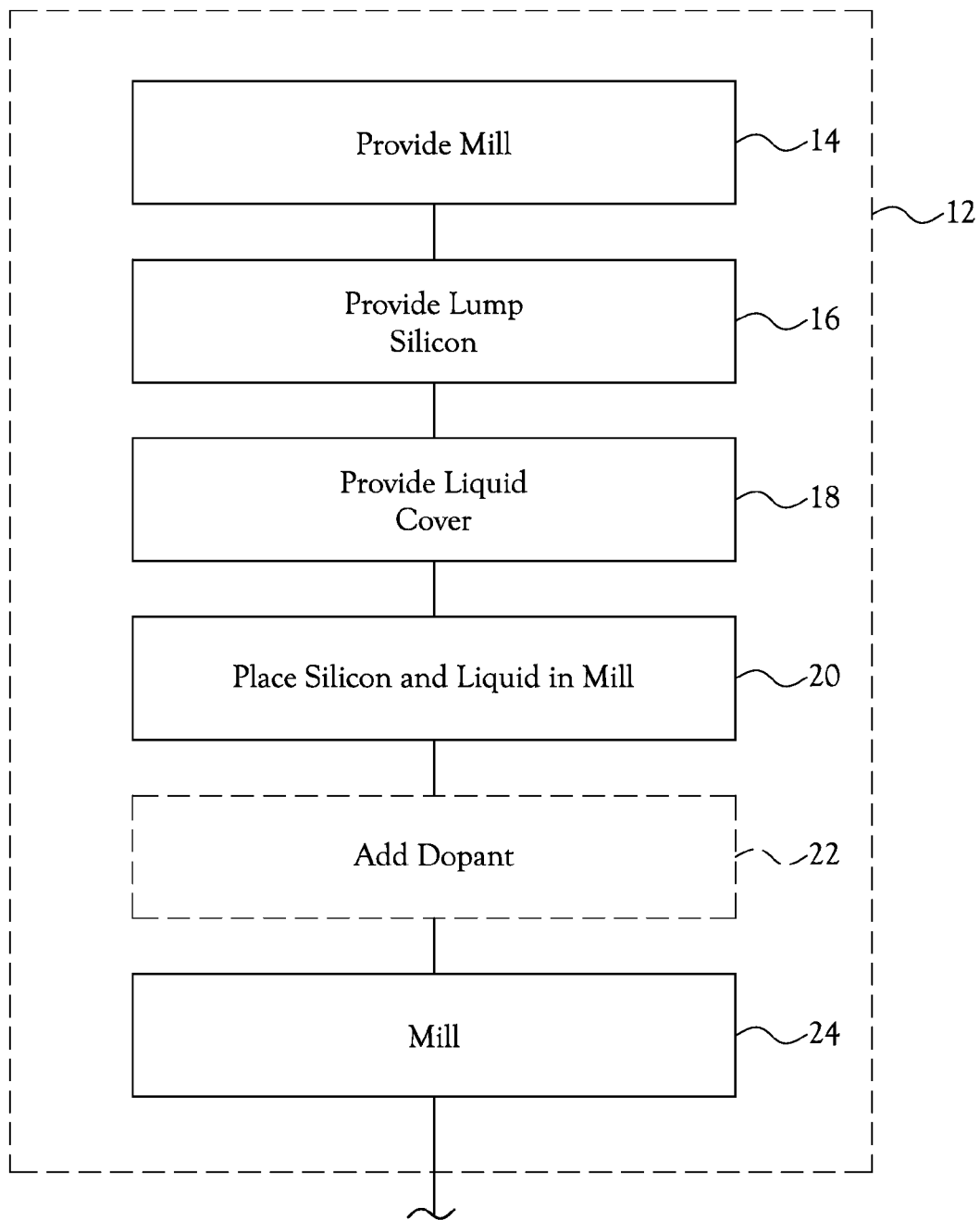
FIG. 2 is a flowchart showing one method of providing a measure of slurry useful in performing the embodiment of the method of producing a semiconductor of FIG. 1.

In one embodiment, the operation 12 of providing the slurry includes a series of operations associated with producing the slurry to be used in the method 10. FIG. 2 is a flowchart illustrating one embodiment of a method of producing the slurry 12. In an initial operation, a mill is provided 14 having internal milling and containment surfaces fabricated from a non-reactive material, such as for example silicon nitride, such that a material may be contained and milled within the mill with limited, and preferably no, contact to surfaces other than silicon nitride surfaces within the mill. For example, in one embodiment, an attrition mill is provided 14 having paddles defining fully dense, oxygen free, pure silicon nitride outer surfaces, linings along the internal portions of the mill, and media. It will be understood that the silicon nitride outer surfaces, linings, and media may be established through chemical vapor deposition (CVD), or physical vapor deposition (PVD) of fully dense, oxygen free, pure silicon nitride on the interior surfaces of the mill, as well as other known methods. It will further be understood that other types of grinding and milling apparatus defining other configurations of milling and containment surfaces may be employed without departing from the spirit and scope of the present invention.

A measure of lump precursor material is provided 16. In one embodiment, the provided lump precursor material consists of bulk pieces of substantially pure silicon, each bulk silicon piece being greater than approximately 99.999% pure (hereinafter referred to as "five-nines purity"). In another embodiment, each bulk silicon piece is approximately 99.9999999% pure (hereinafter referred to as "nine-nines purity"). In another embodiment, the provided lump precursor material consists of bulk pieces of substantially pure aluminum. In yet another embodiment, the provided lump precursor material consists of a combination of bulk pieces of substantially pure pieces of silicon and aluminum. In more discreet embodiments, a measure of lump precursor material is provided 16 which has been doped by alloying the precursor material with materials desired in the finished semiconductor material.

In another operation, the liquid cover 18 is provided. The lump precursor material and liquid cover are combined and introduced into the mill. In the illustrated embodiment, combination of the lump precursor material with the liquid cover and introduction of the combination thereof into the mill occurs simultaneously as both the lump precursor material and the liquid cover are placed 20 into the attrition mill. However, it will be understood that, depending upon the specific type of mill provided 14 and the procedure for loading items to be milled therein, the chemically reactive nature of the lump precursor material and the need to protect the lump precursor material from reacting with atmospheric contaminants may require combination of the lump precursor material with the liquid cover at a time other than the time at which the lump precursor material and liquid cover are loaded into the mill. To this effect, in another embodiment, the lump precursor material and liquid cover are combined and then the combination thereof is introduced into the mill. In yet another embodiment, the lump precursor material and liquid cover are first introduced into the mill separately, and then combined within the mill.

Following the combination of the lump precursor material with the liquid cover and placing thereof into the mill 20, the mill is activated 24, whereupon the contents of the mill are milled to reduce the average particle size of the lump precursor material under the cover of the liquid cover. The silicon nitride milling surfaces and silicon nitride containment surfaces of the mill discourage grinding-based or attrition-based contamination of the precursor material during milling 24. Also, in an embodiment in which an attrition mill is provided, the attrition milling 24 of the lump precursor material encourages diminution of the precursor material into powder wherein the average grain size of the precursor material is reduced to a very fine particle size, i.e., less than 150 microns in one embodiment, and less than 300 nanometers in another embodiment. In embodiments in which the precursor material includes silicon, it will be understood that silicon particles of this approximate size have a similar lattice structure and are substantially non-conductive. In a preferred embodiment, the liquid cover consists of a cryogen, such as for example liquid nitrogen, liquid argon, or other such suitable cryogen, such that the milling 24 of the lump precursor material within the liquid cover occurs as cryogenic milling. It will be understood that such cryogenic milling of the lump precursor material results in speedier and more efficient diminution of the lump precursor material into powder, and furthermore results in easier reduction of the average grain size of the precursor material to a very fine particle size. However, it will be understood that such cryogenic milling of the lump precursor material is not necessary to accomplish the method 10 of the present invention. Furthermore, those of skill in the art will recognize other materials and combinations of materials suitable for use as the liquid portion of the slurry, and such other suitable materials may be used without departing from the spirit and scope of the present invention.

In an optional operation, prior to or during milling 24 of the lump precursor material, at least one dopant is added 22 to the mixture of precursor and liquid cover. As will be described in further detail below, the method 10 ultimately results in the precursor powder and dopant mixture being separated from the liquid cover and melted to form a semiconductor member. Thus, upon melting the precursor powder including the dispersed dopant, the resultant semiconductor member exhibits a uniformly dispersed mixture of the dopant and precursor. In one embodiment, the dopant is selected from the group consisting of boron and phosphorous. In embodiments in which the at least one dopant is added 22, such dopant may be added to the lump precursor material, to the liquid cover, or to the combination thereof at any time prior to the conclusion of milling 24, such that the process of milling 24 the lump precursor material and liquid cover results in substantially uniform dispersion of the dopant into the slurry. Those skilled in the art will recognize other methods for producing a slurry of a precursor powder that is essentially free of oxides and other undesirable impurities and a liquid cover, and such methods may be used without departing from the spirit and scope of the present invention.

Figure 3:
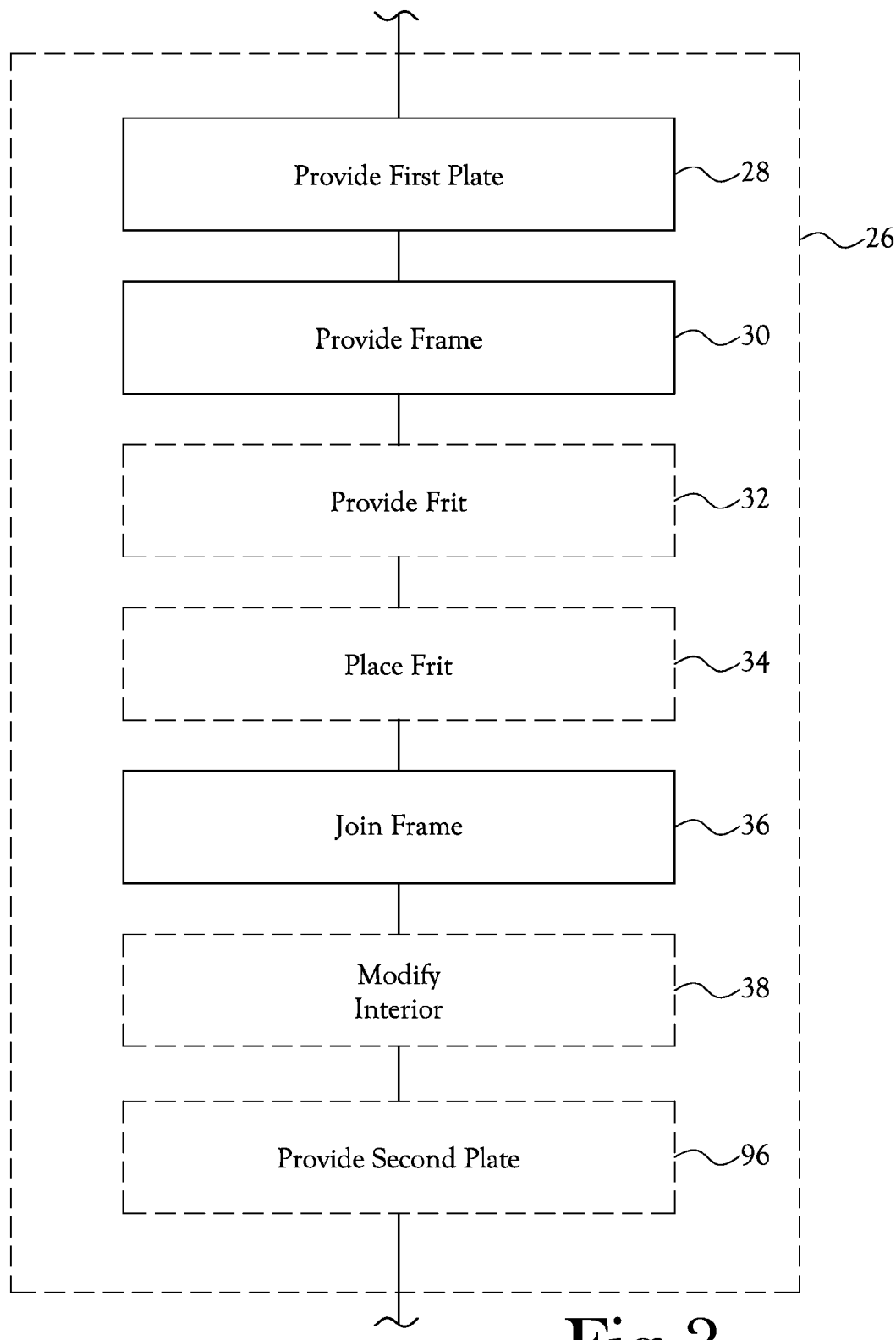
FIG. 3 is a flowchart showing one method of providing a mold useful in performing the embodiment of the method of producing a semiconductor of FIG. 1.
Figure 4:
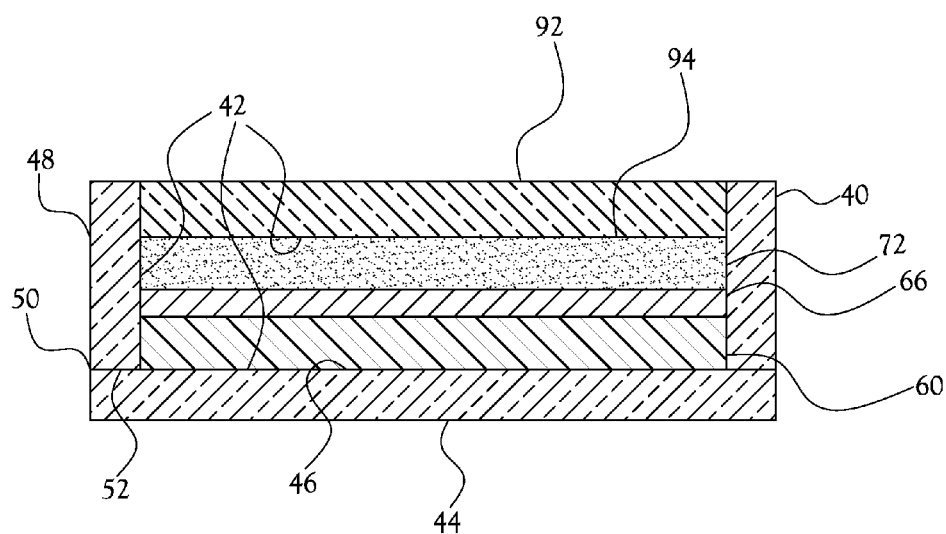
FIG. 4 is a cross-sectional view showing a mold containing various components useful in performing the embodiment of the method of producing a semiconductor of FIG. 1.

Referring again to FIG. 1, once the slurry is provided 12, a mold is provided 26. FIG. 3 illustrates a method of providing the mold 26 used in one embodiment of the method 10 of the present invention, and FIG. 4 illustrates a cross-sectional view of the mold 40. As shown in FIG. 4, the mold 40 defines a set of interior surfaces 42 conforming generally to the shape of the desired finished semiconductor member. The mold 40 is selected from a material which allows heating and melting of precursor powder placed within the mold 40, and as will further be discussed below, the composition of the mold 40 is, at least in part, dependent upon the device to be used in heating and melting the precursor powder. For example, in certain embodiments in which radiant light energy is used, the mold 40 is selected to be at least partially transparent, or at least translucent, to the radiant light energy, in order to allow radiant light energy to pass through the mold 40 to the mold interior 42. In other embodiments in which electricity is used to heat the precursor powder, the mold is selected to be electrically resistive of such electricity, such that electricity passing through the mold is converted to heat, thereby causing heating of the mold. Those skilled in the art will recognize other materials suitable for composition of the mold 40.

In the illustrated embodiment of FIGS. 4-6, the mold 40 is selected to be substantially transparent to radiant light energy, and is composed of a material selected from the group consisting of borosilicate glass and low iron soda lime glass (hereinafter "glass"). In the embodiment of FIGS. 3 and 4, a first glass plate 44 is provided 28 defining an upper surface 46 conforming to an interior bottom surface of the desired mold 40. A glass frame 48 is provided 30 which is sized to fit adjacent the perimeter of the interior bottom surface of the plate 44. The frame 48 is joined 36 adjacent a perimeter 50 of the interior bottom surface 46, such that the frame 48 encloses the interior bottom surface 46 and cooperates with the plate to define an interior of the mold 40 and to prevent loss of the precursor powder from the interior of the mold 40. In an optional operation shown in the illustrated embodiment, a bonding fit 52 is provided 32 and is placed 34 between the frame 48 and the plate 44 in order to assist in joining 36 the frame 48 to the plate 44 to form the mold 40. In another embodiment, the frame 48 and the plate 44 are integrally formed. Those skilled in the art will recognize other means for joining 36 the plate 44 and the frame 48 to form the mold 40, and such means may be used without departing from the spirit and scope of the present invention.

In embodiments in which the method 10 is used to manufacture a semiconductor for use in the manufacture of solar cells, it is known that minimization of the grain boundaries between sides of a semiconductor wafer used in a solar cell is desirable to allow greater efficiency of conversion of photons to electrons. Thus, in an optional operation shown in the illustrated embodiment, the interior surface 42 of the mold is modified 38 to improve the process of melting precursor to form a semiconductor wafer while maintaining the purity and crystal alignment of the melted and crystallized precursor. For example, in one embodiment, the interior surface 42 of the mold is modified 38 to yield a mold interior surface 42 that (1) essentially does not react with the precursor and (2) has a crystal structure similar to that of the semiconductor to be manufactured. In certain embodiments, modification 38 of the mold interior surface includes deposition of a layer of material along the interior surface 42 of the mold. For example, in one embodiment, such modification is accomplished by applying a layer of non-reactive, substantially non-porous material, such as for example fully dense, oxygen free silicon nitride or pyrolitic graphite, to the interior surface 42 of the mold using a method selected from the group consisting of sputtering, chemical vapor deposition (CVD), physical vapor deposition (PVD), ion implantation, and metalizing. It will be understood that, in one embodiment, the purpose of the interior cavity modification 38 is to aid in orienting crystals formed within the mold 40 as melted precursor crystallizes within the mold 40. For example, in one embodiment, the modification 38 allows the mold 40 to be differentially cooled from the bottom of the mold, thereby orienting the semiconductor crystals to grow from the bottom interior surface 46 of the mold 40 upward.

Following provision 26 of the mold 40, and with reference to FIGS. 1 and 4, in several embodiments, an optional interlayer 60 is provided 54. The interlayer 60 is placed 56 along an interior bottom surface 46 of the mold 40, so as to create a forgiving layer to allow thermal expansion and contraction of semiconductor materials along the interior of the mold 40. In one embodiment, the interlayer 60 is a polymer-type urethane of a thin cross section. However, other suitable materials will be apparent to one of skill in the art.

As discussed above, in certain embodiments, an amount of dopant, such as phosphorous, boron, or other dopant, is optionally mixed directly into the fine-milled precursor to assist in creating the semiconductor. In another optional operation shown in the illustrated embodiment, a thin layer of dopant 66, such as for example boron, phosphorous, or other dopant, is provided 68 and applied 70 to an exposed surface of the interlayer 60. Similarly to the mixed dopant discussed above, the layer of dopant 66 assists in creating the semiconductor from the precursor during melting and cooling of the precursor. In one embodiment, the interlayer 60 and the dopant layer 66 are each applied within the mold 40 by chemical vapor deposition. In another embodiment, the interlayer 60 and the dopant layer 66 are each held adjacent the mold 40 by a paste or other suitable adhesive. Those skilled in the art will recognize other means which may be used to apply and secure the interlayer 60 and the dopant layer 66, and such means may be used without departing from the spirit and scope of the present invention.

Following provision 26 of the mold 40 and application into the mold 40 of the interlayer 56 and the dopant layer 66 as described above, the slurry 72 is introduced 74 into the mold 40. Thereafter, the slurry 72 is distributed into an even layer within the mold 40. In certain embodiments (not shown), at least a portion of the interior surface of the mold is treated with a wetting agent to facilitate even distribution of the slurry 72 and to discourage beading of the slurry 72 within the mold 40. In certain more discreet embodiments, only the portion of the mold 40 that is to be in contact with the slurry 72 is treated with the wetting agent. It will be understood that, in selecting the wetting agent, it is desirable to select a wetting agent that does not react with the slurry or the mold. Accordingly, in one embodiment, the wetting agent is selected to be substantially non-porous. In another embodiment, the wetting agent is selected to be a material not containing an oxide or other substance reactive with the slurry or the mold. In another embodiment, the wetting agent is selected to be a material that does not include transition metals, organo-metalics, or the like. In certain embodiments that include treatment of at least a portion of the mold with a wetting agent, the wetting agent is silicon nitride. In other embodiments, the wetting agent is silicon carbide. Those skilled in the art will recognize other suitable wetting agents which may be used without departing from the spirit and scope of the present invention. The treatment encourages the slurry to spread across a bottom interior surface of the mold, thus encouraging the formation of a semiconductor member having a uniform thickness spreading throughout the entire mold.

Figure 5:
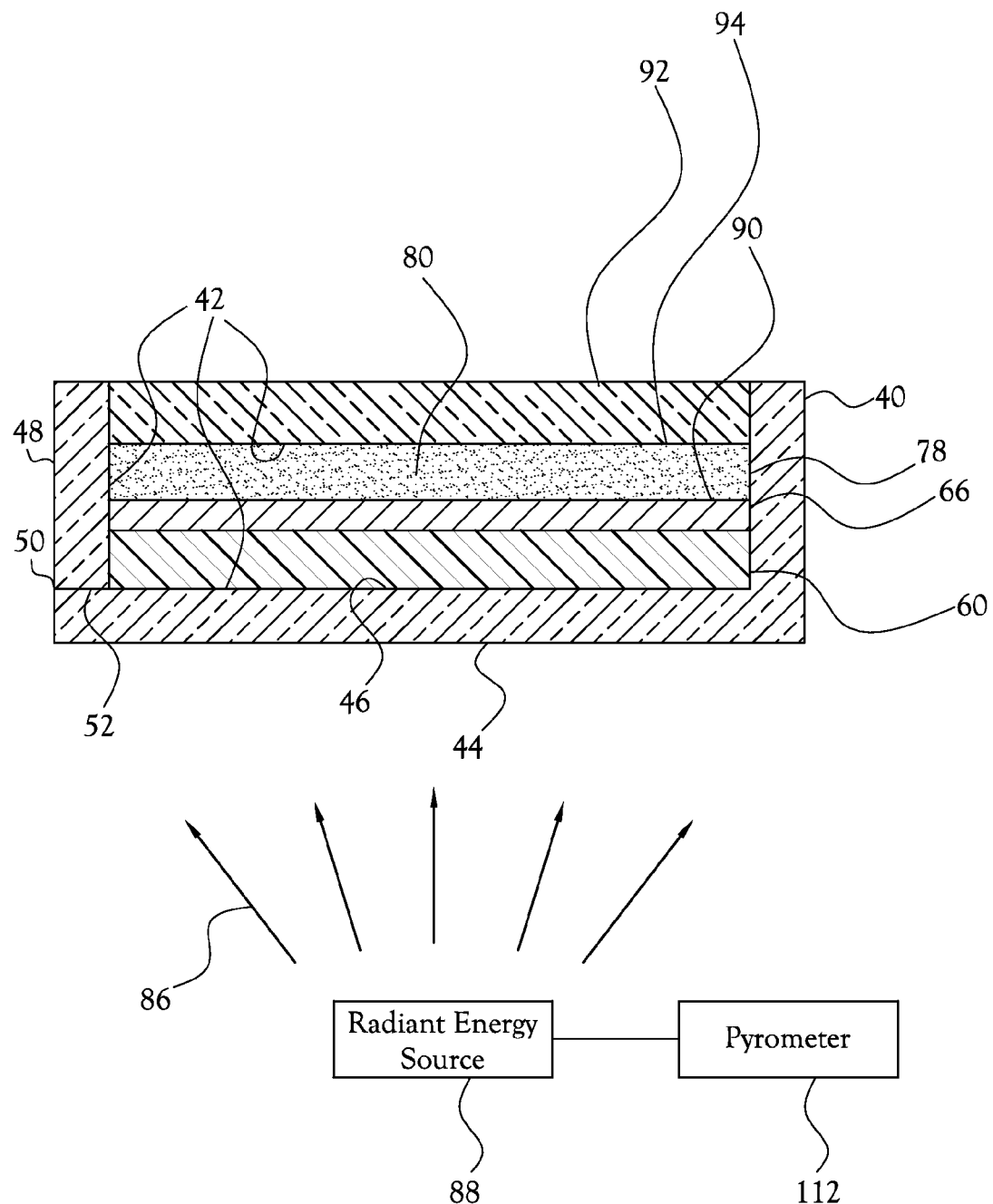
FIG. 5 is a cross-sectional view of the mold and components of FIG. 4, showing application of radiant light energy to the mold to heat the components.

Referring to FIGS. 1 and 5, the precursor powder 78 is precipitated 76 from the slurry 72 to form a preform 80 of a semiconductor member within the mold 40 opposite the interlayer 60 from the bottom interior surface 46 of the mold 40. In one embodiment, such precipitation 76 of the precursor powder 78 from the slurry 72 occurs by evaporation of the liquid component of the slurry 72. In another embodiment of the present invention, as shown in the optional operation of FIG. 1, the mold 40 is vibrated 82 to encourage the deposition of a uniform layer of the precursor powder 78 within the mold 40. It will be understood that in addition to, or in alternative to, evaporation, freeze casting can be used to accomplish precipitation 76 of the precursor powder 78 from the slurry 72, thus further limiting oxidation of the precursor powder 78. It will further be understood that other methods and techniques may be used accomplish precipitation 76 of the precursor powder 78 from the slurry 72 to form the preform 80 without departing from the spirit and scope of the present invention.

It has been found that, in certain embodiments of the present invention in which the precursor powder 78 component of the slurry 72 consists essentially of silicon particles having an average size of less than, or equal to, approximately twelve (12) microns, the preform 80 resulting from precipitation 76 has a packing density of approximately seventy-five (75) percent, resulting in lower permeability and higher thermal conductivity of the preform 80. This lower permeability reduces the percentage of the preform's internal surface area that is accessible to carbon oxide gases, thereby reducing the number of loci available for the oxidation-reduction reaction that yields silicon carbide and the dissolved-oxygen complexes within the precursor powder 78. The higher thermal conductivity permits a reduction in the length of the heating-cooling cycle discussed below, further limiting the synthesis of those impurities.

As shown in FIGS. 4 and 5, in several embodiments, the mold 40 includes a second plate 92 which is optionally provided 96 (see FIG. 3) and positioned 98 adjacent the precursor powder 78 opposite the first plate 44 of the mold 40. The second plate 92 is spaced apart from the first plate 44 a distance sufficient to establish a planar capillary space 94 between the first and second plates 44, 92. In one embodiment, in which the first plate 44 lies substantially horizontally below the precursor powder 78, dopant 66, and interlayer 60, the second plate 92 is disposed horizontally, resting on the substantially horizontal layer of precursor powder 78. In another embodiment, the second plate 92 is secured to and supported by the remainder of the mold 40. Those skilled in the art will recognize other suitable means for positioning the second plate 92 in overlapping, spaced apart relation to the first plate 44 so as to establish the planar capillary space 94, and such other means may be used without departing from the spirit and scope of the present invention.

Following precipitation 76 of the precursor powder 78 from the slurry 72 and optional vibration 82 and placement of the second plate 92, the preform 80 of the semiconductor is melted 84 and cooled 100 to form a semiconductor member adjacent the interlayer 60. It will be understood that heating the preform 80 to the point of melting 84 generally increases the reactivity of the silicon forming the preform 80. Thus, in several embodiments, melting of the preform 80 is performed through a high energy heating device during a brief time interval. For example, in several embodiments, melting 84 of the preform 80 is performed during a time interval of less than five minutes and at a temperature of less than 1450 degrees Centigrade. In one embodiment, melting 84 of the preform occurs during a time interval of less than one minute and at a temperature of approximately 1435 degrees Centigrade.

Referring to FIG. 5, in one embodiment, the mold 40 containing the preform 80, the interlayer 60, and the dopant layer 66, as described above, is placed in a cover atmosphere (not shown) which further discourages oxidation of the preform 80. In one embodiment, the cover atmosphere is an argon gas atmosphere. A radiant energy source 88, such as a plasma arc lamp, is provided and configured to direct an emission of radiant energy 86 toward the preform 80. In one embodiment, melting 84 of the preform 80 is accomplished by activation of the radiant energy source 88, thereby exposing the preform 80 to the radiant energy 86 emitted from the radiant energy source. Thereafter, the radiant energy source 88 is deactivated, and the melted semiconductor precursor is allowed to cool 100.

It will be understood that, upon melting 84 of the preform 80, an amount of precursor vapor is released into the cover atmosphere surrounding the mold 40. It will further be understood that, in embodiments employing a plasma arc lamp as the radiant energy source 88, contact of the plasma arc lamp with such precursor vapor can result in deposition of precursor material and other impurities upon the surface of the plasma arc lamp, thus hindering the output of radiant energy 86 from the plasma arc lamp. Thus, in certain embodiments, the mold 40 serves in part to shield the radiant energy source 88 from precursor vapor generated by the melting 84 of the silicon preform 80. In other embodiments, the cover atmosphere is made to flow in a direction over the mold 40 away from the radiant energy source 88, such that the silicon vapor is carried away from the radiant energy source 88.

For example, in the illustrated embodiment of FIGS. 5 and 6, the plasma arc lamp radiant energy source 88 is provided at a position beneath the mold 40, such that radiant energy 86 is directed generally upwardly through the first glass plate 44 of the mold 40. As discussed above, and with reference to FIG. 5, in certain embodiments the material selected for construction of the mold 40, including, if provided, the second plate 92, is substantially transparent, or at least translucent, to the radiant energy 86 emitted from the radiant energy source 88. Thus, at least a portion the radiant energy 86 passes through the mold 40 and causes relatively little heating of the mold 40 in comparison to the heating of the precursor powder 78. It has been found in melting 84 and cooling 100 the preform 80 using a plasma arc lamp that radiant energy 86 which contacts the mold 40 and is allowed to pass through the mold 40 contacts and heats an outer layer of precursor powder granules 78 forming the preform 80.

Upon exposure to the radiant energy 86 of the radiant energy source 88, the precursor powder 78 absorbs the radiant energy 86 and very rapidly melts at temperatures in excess of 1420 degrees Centigrade. However, once the outer layer of the precursor powder 78 melts into liquid, the resulting very pure liquid precursor is more transparent to the radiant energy 86 from the radiant energy source 88. Thus, once melted, a greater portion of the radiant energy 86 passes through the melted portion of the preform 80 to adjacent particles of precursor powder 78. In this manner, the radiant energy source 88 heats and melts the preform 80 while leaving the glass mold 40 substantially unmelted.

As discussed above, upon melting the preform 80, the radiant energy source is deactivated, thereby discontinuing exposure of the mold 40 and the precursor 78, dopant 66, and interlayer 60 contained therein to the radiant energy 86 from the radiant energy source 88. In certain embodiments, and as part of the operation 84 of melting the preform 80, the temperature of at least one of the mold 40 and the preform 80 is monitored in order to verify that the radiant energy source 88 has heated the preform 80 to a temperature sufficient to melt the preform. For example, in one embodiment, at least one pyrometer 112 of the type known in the art is provided to monitor the temperature of at least one of the mold 40 and the preform 80 and to provide a signal indicating the monitored temperature. In one embodiment, the pyrometer 112 is placed in communication with the radiant energy source 88 such that, once the preform 80 has melted, the pyrometer 112 generates and communicates a signal to the radiant energy source 88 to deactivate the radiant energy source 88.

Referring to FIGS. 5 and 6, in embodiments in which the dopant layer 66 is provided 68 and placed 70 in the mold 40, at an interface 90 of the melted precursor 78 with the dopant layer 66, the dopant 66 diffuses and reacts with the precursor 78, resulting in a boundary 93 between the interlayer 60 and the melted precursor 78 which is rich in substances helpful in improving the performance of a semiconductor. For example, in the illustrated embodiment, in which the provided dopant 66 is boron, the boundary 93 between the interlayer 60 and the melted precursor 78 is rich in silicon hexaboride, a very desirable element in the P-N junction of a solar cell for increasing solar cell efficiency.

In embodiments in which the second plate 92 is provided to form the planar capillary space 94, upon melting the precursor 78, the melted precursor 78 wicks throughout the capillary space 94 to substantially fill the capillary space 94 adjacent the second plate 92. Thereafter, the melted precursor 78 and other contents of the mold 40 are allowed to cool 100 and to form a semiconductor member 110 adjacent the interlayer 60.

It will be understood that the plasma arc lamp 88 of the present embodiment allows very quick heating and cooling and high efficiency coupling of the energy 86 from the plasma arc lamp 88 with the precursor 78, while the material forming the mold 40 is at least partially transparent to the energy 86 from the plasma arc lamp 88. In embodiments in which the interlayer 60 is provided, the interlayer 60 provides a mechanical stress reliever to the stresses which build up due to the expansion and contraction of the precursor 78 during heating 84 and cooling 100, while the mold 40 remains relatively cool. In embodiments in which the second plate 92 is positioned to form the capillary space 94 in the mold 40, the capillary wicking of the melted precursor 78 allows the preform 80 to be melted quickly and thinly, often but not necessarily with a thickness in the range of 400 microns or less, and in certain embodiments, less than 200 microns.

Figure 7:
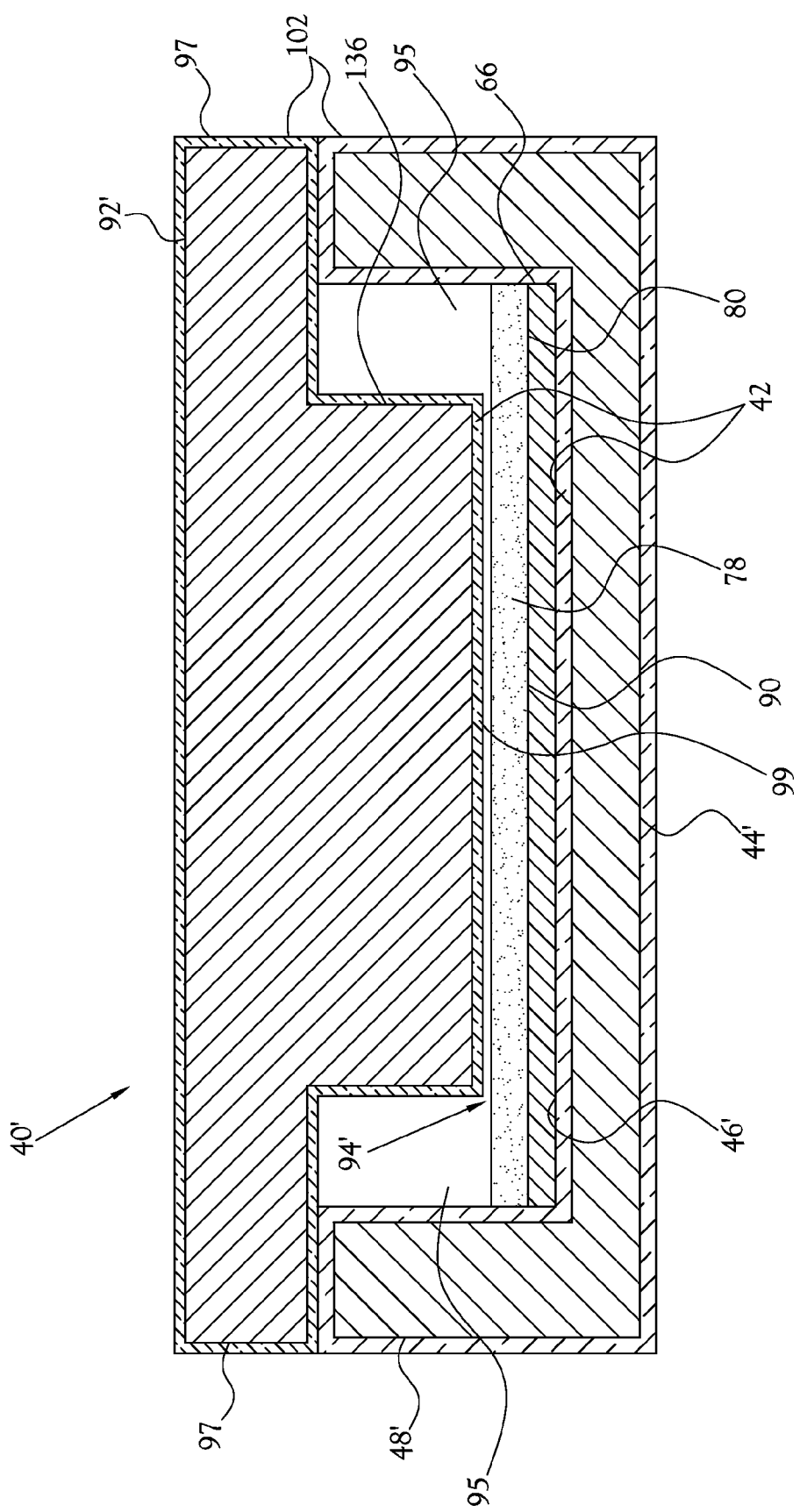
FIG. 7 is a cross-sectional view of a mold containing various components useful in performing another embodiment of the method of producing a semiconductor.

As mentioned above, in other embodiments of the method of the present invention, the operations of melting and cooling the preform are performed using other heating apparatus, and in several embodiments, the material for fabricating the mold is selected to accommodate various features of the particular heating apparatus used. Accordingly, FIG. 7 illustrates a cross-sectional view of another mold 40' which is used in another embodiment of the method 10', illustrated in FIG. 8. The method 10' employs an induction heating apparatus 104 for melting 84' and cooling 100' the preform 80. Accordingly, in the illustrated embodiment of FIGS. 7 and 8, a mold 40' is provided 26' which is composed of a material easily warmed through inductive heating, such as for example graphite, pyrolitic graphite, or the like. As discussed above, the mold 40' defines a set of interior surfaces 42' conforming generally to the shape of the desired finished semiconductor member. Similarly to the embodiment discussed above, the mold 40' includes a bottom first plate 44' which defines an upper surface 46' conforming to an interior bottom surface of the desired mold 40'. A circumferential lip 48' is integrally formed along the perimeter of the upper surface 46' of the plate 44' and extends generally upwardly from the plate 44', such that the lip 48' cooperates with the plate 44' to define a vessel to prevent loss of the precursor powder from the interior 42' of the mold 40'. At least the interior surfaces 42' of the mold 40', and preferably all surfaces of the mold 40', are coated with a ceramic material 102 which is substantially non-reactive to the precursor powder. In the illustrated embodiment, the ceramic material 102 is selected from the group consisting of silicon nitride, silicon carbide, and fused quartz. In one embodiment, the ceramic material 102 is selected to be dense, oxygen free, pure silicon nitride, which is deposited onto the surfaces of the mold 40'.

A second plate 92' is provided in a parallel, spaced apart relationship to the first plate 44' to establish a capillary space 94' between the first and second plates 44', 92'. In the illustrated embodiment, the second plate 92' can include a rectangular first portion 136 having a lower surface 99 configured to be positioned in a parallel-planar, offset relationship to the upper surface 46' of the first plate 44' to define the capillary space 94'. A circumferential flange 97 extends horizontally from an upper portion of the first portion 136 and is sized to rest along the circumferential lip 48' to position the first portion lower surface 99 within the mold 40' to define the capillary space 94'. In the illustrated embodiment, the first portion 136 of the second plate 92 is sized slightly smaller than the space defined within the circumferential lip 48'. In this embodiment the first portion 136 can be received generally centered within and offset from the circumferential lip 48', such that a relief space 95 is defined between the lip 48' and the first portion 136.

Figure 9:
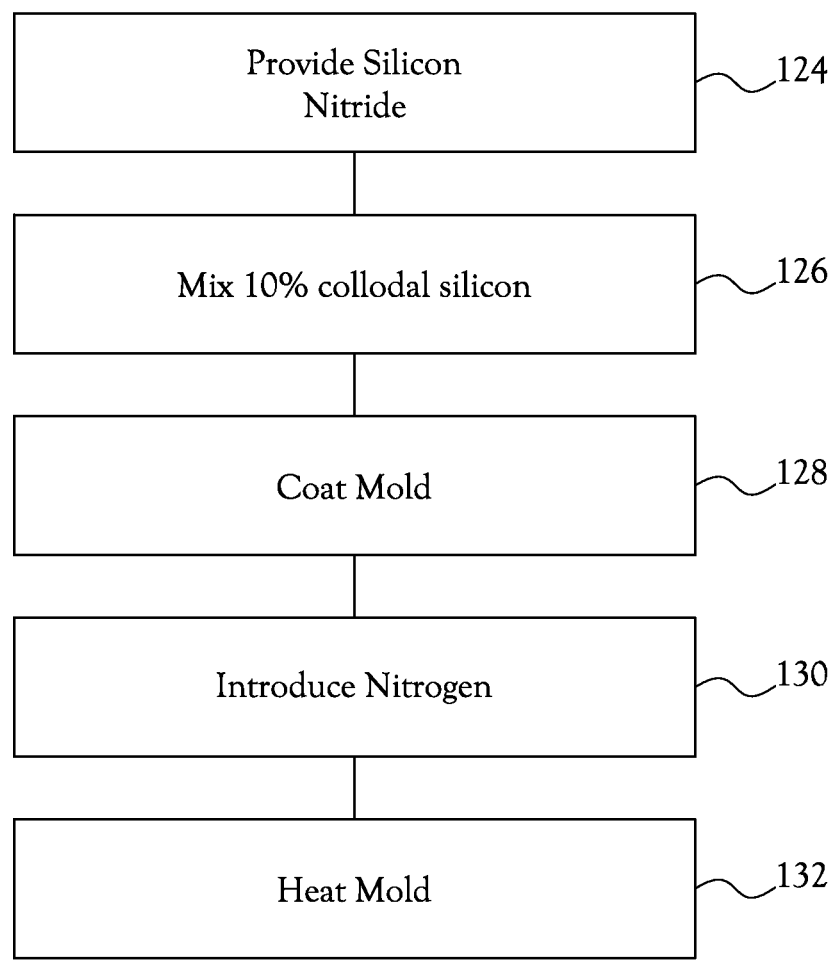
FIG. 9 is a flowchart showing one method of providing a ceramic coating to the mold useful in performing the embodiment of the method of producing a semiconductor of FIG. 8.

Similarly to the mold 40', the second plate 92' can be coated with a ceramic material 102 which is substantially non-reactive to the precursor powder. In certain embodiments of the method 10', the operation of providing 26' the mold 40' includes a series of operations for coating the mold 40' with the ceramic material 102. For example, FIG. 9 is a flowchart illustrating one embodiment of a method of coating the mold 40'. As shown in FIG. 9, in one embodiment, a measure of pure, finely divided silicon nitride is provided 124. In a preferred embodiment, the provided silicon nitride is more than 98% pure, but does contain less than 2% silica, oxygen, and silicon. The silicon nitride is mixed 126 with 10% colloidal silica. It will be understood by one of skill in the art that the colloidal silica is commonly manufactured from an alkali-silicate precursor, which contains an alkali, such as for example sodium, prior to an ion exchange which is performed to make the colloidal silica from the precursor. In one embodiment, the colloidal silica used is substantially free of the alkali. Thereafter, the mold 40' is coated 128 with the mixture of silicon nitride and colloidal silica. Following coating 128 of the mold 40', the mold 40' is placed 130 in the presence of nitrogen and then heated 132 to a temperature in excess of 1,400 degrees Centigrade in the presence of the nitrogen. Upon heating 132 the coated mold 40', the silica of the mixture reacts with the nitrogen to form silicon nitride, and the freed oxygen reacts with the graphite of the mold 40' and the carbon of the mixture to make carbon dioxide. Thus, the coating forms the ceramic material 102 through a process whereby the coating is made more pure and dense.

Figure 8:
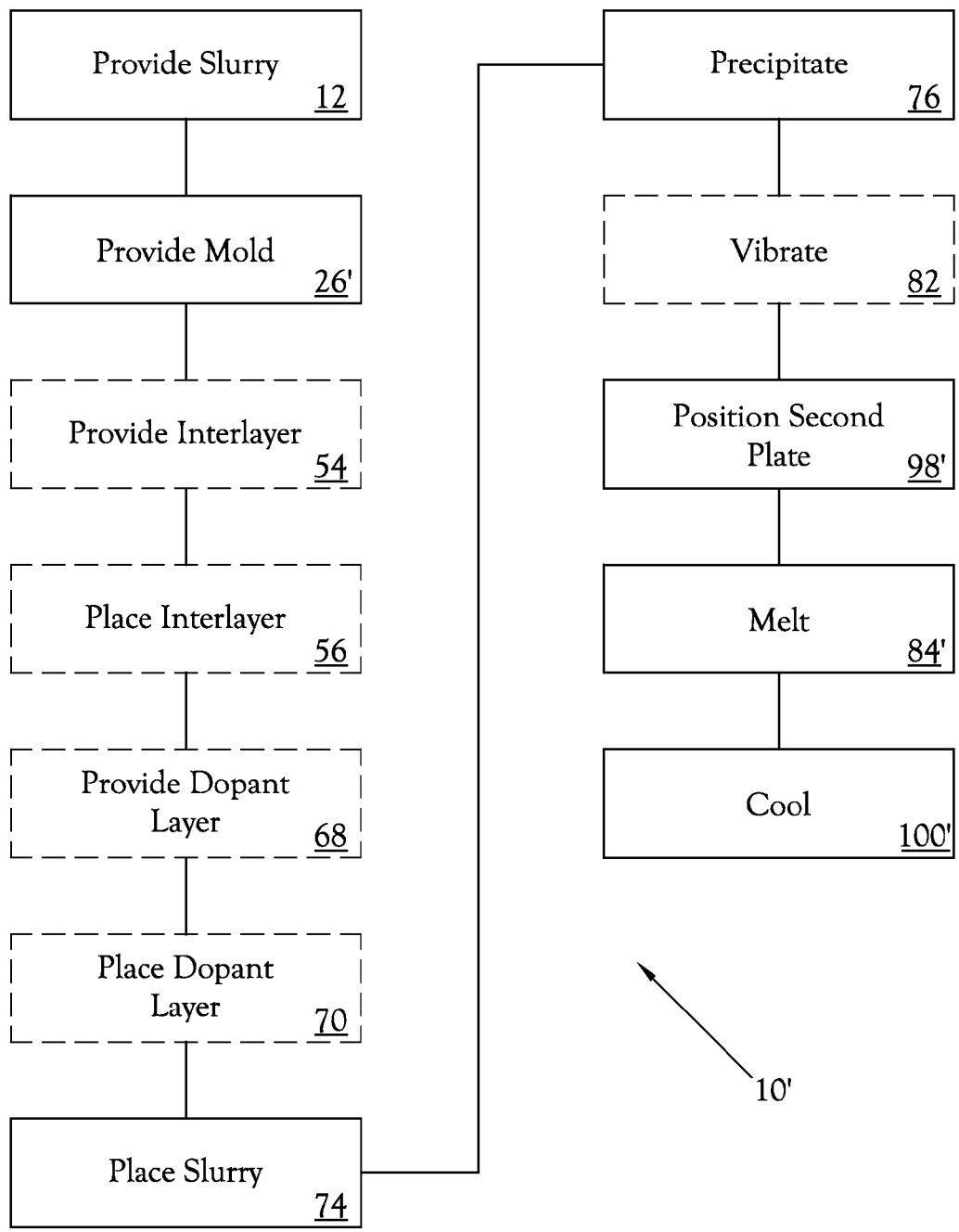
FIG. 8 is a flowchart showing another embodiment of the method of producing a semiconductor of the present invention.

Referring to FIGS. 7 and 8, in the illustrated embodiment of the method 10', the slurry is provided 12 as discussed above. Following the above-discussed provision 26' of the mold 40', an interlayer 60 is optionally provided 54 and placed 56 in the mold 40' to create a forgiving layer to allow thermal expansion and contraction of semiconductor materials along the interior of the mold 40' and a delaminating layer to assist in removal of at least one of the second plate 92' and the mold 40' from the finished semiconductor. The dopant layer 66 is optionally provided 68 and placed 70 in the mold 40' along the interlayer 60 opposite the first plate 44' of the mold 40'. The slurry is then placed 74 into the mold 40', precipitated 76, and optionally vibrated 82 as discussed above to create the preform 80, whereupon the second plate 92' is positioned 98' proximate the first plate 44' to form the capillary space 94' between the second plate 92' and the mold 40'.

Figure 10:
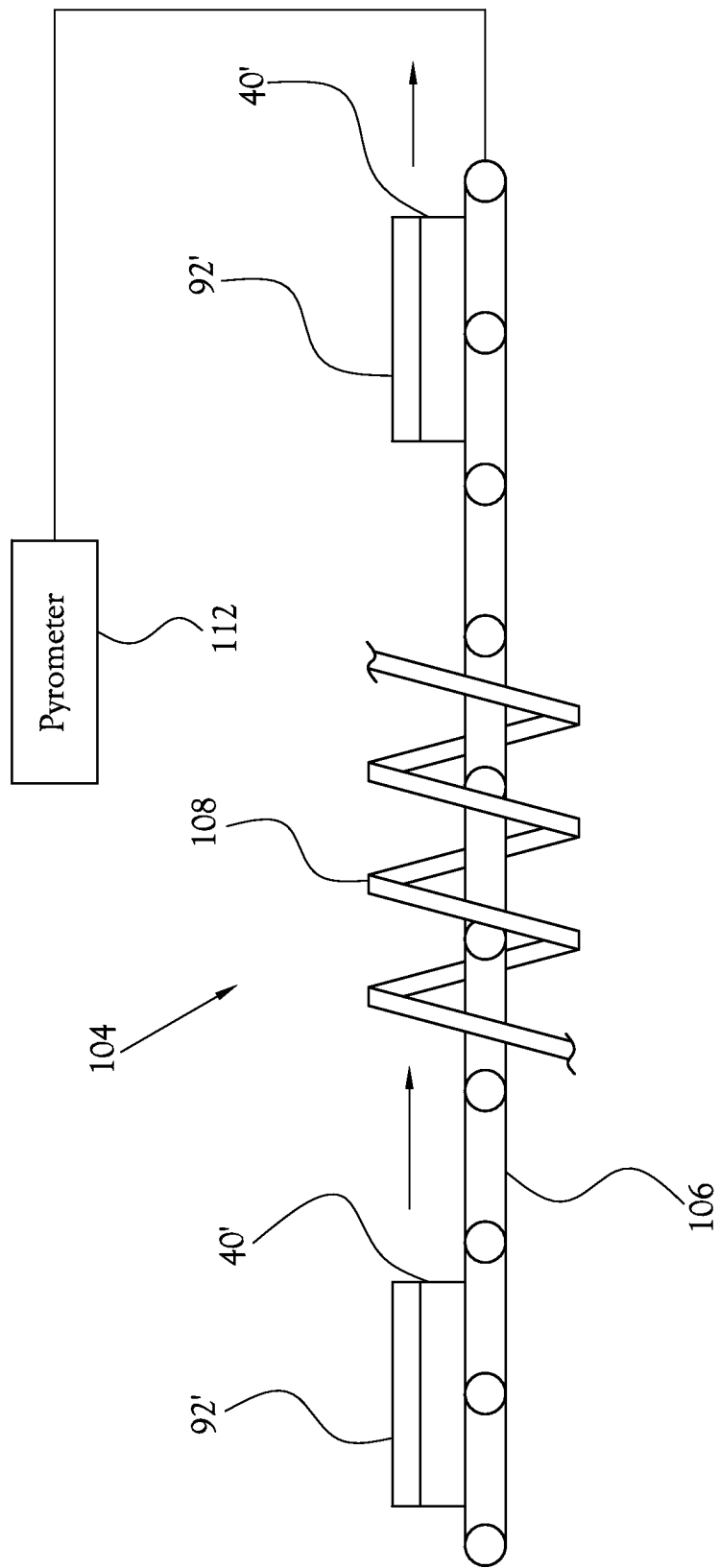
FIG. 10 is a schematic side view depicting conveyance of the mold of FIG. 7 through an induction heating apparatus.

Referring to FIGS. 8 and 10, following precipitation 76 of the precursor powder 78 from the slurry, optional vibration 82, and placement of the second plate 92', the preform 80 of the semiconductor member is melted 84' using an inductive heater 104 to form a semiconductor member adjacent the interlayer 60. The mold 40' containing the various unfinished components of the semiconductor, including the preform 80, is placed within a cover atmosphere (not shown) which discourages oxidation of the preform 80. As shown in FIG. 10, while within the cover atmosphere, the mold 40' is conveyed by a conveyor, pushed along rails, or otherwise conveyed by a similar conveyance device 106 through a series of inductive coils 108 of the type known to one of ordinary skill in the art. As the mold 40 passes through the inductive coils 108, the inductive coils 108 couple with the material forming the mold 40' to rapidly heat the mold 40', thereby also rapidly heating and melting the preform 80. In one embodiment, the inductive coils 108 consist of a set of water-cooled inductive coils which are sized and shaped to conform closely to the shape of the combined mold 40' and plate 92', such that inductive coupling between the material forming the mold 40' and plate 92' and the inductive coils 108 is maximized. However, numerous configurations for the inductive coils 108 suitable for use in the method 10' will be recognized by one of skill in the art.

Figure 11:
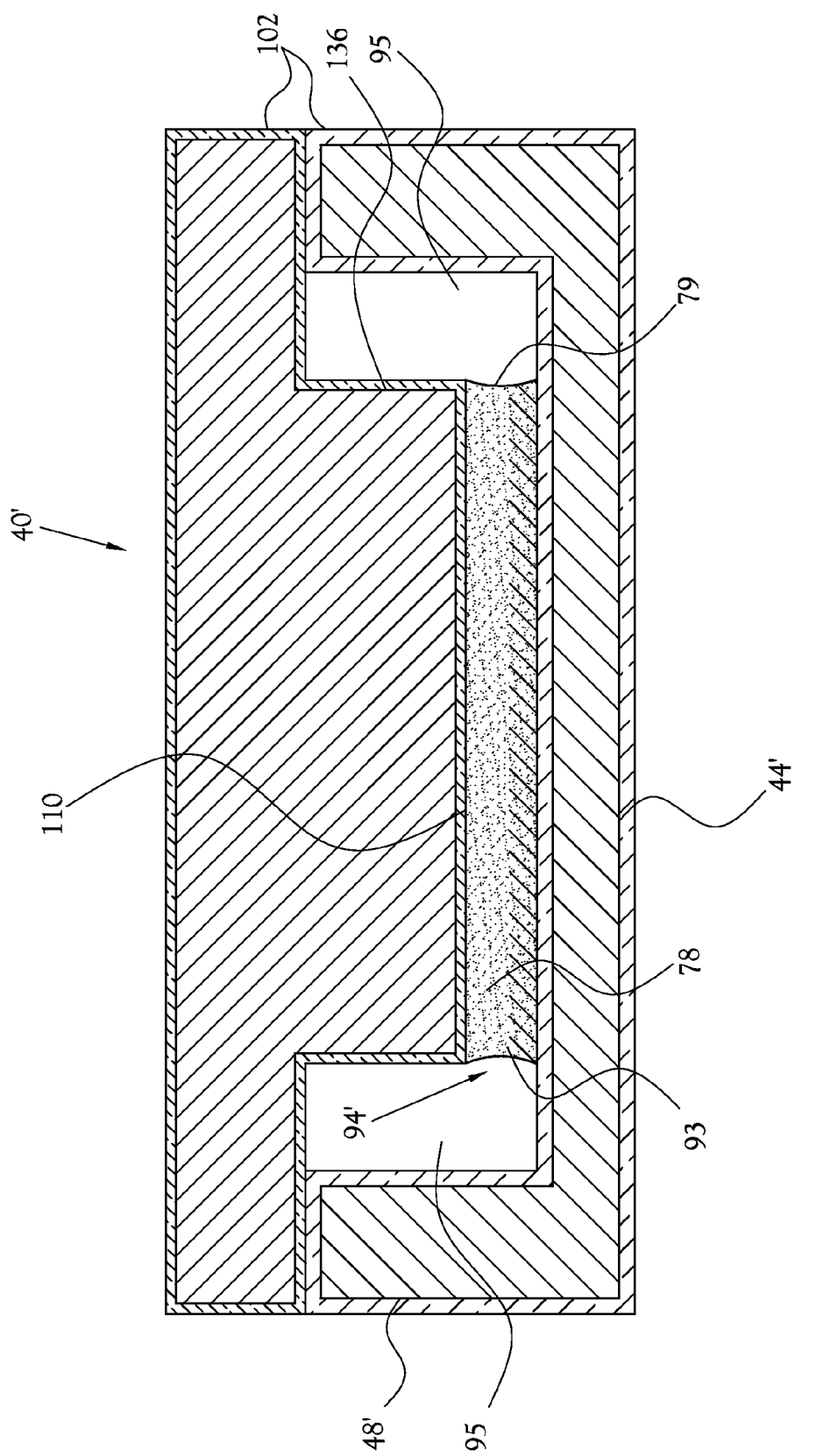
FIG. 11 is a cross-sectional view of the mold of FIG. 7 containing the finished semiconductor following heating and cooling of the mold components.

As discussed above, in certain embodiments, a pyrometer 112 is provided to monitor the temperature of the preform 80 and to verify melting of the preform 80. As discussed above, following melting 84' of the preform 80 within the mold 40', the mold 40' and its contents are allowed to cool 100'. In the illustrated embodiment, such cooling 100' of the mold 40' is accomplished by further conveying the mold 40' and its contents out from within the inductive coils 108, whereupon heating 84' of the mold 40' ceases, and the mold 40' and its contents are allowed to cool 100'. In one embodiment a pyrometer 112 is provided in communication with the conveyor to signal the conveyor to convey the mold 40' and its contents out from within the inductive coils 108 upon melting of the preform 80. Referring to FIG. 11, in certain embodiments, upon melting of the precursor material 78 within the mold 40', the melted precursor material 78 wicks within the capillary space 94' to substantially fill the capillary space 94'. In the illustrated embodiment, the melted precursor material 78 forms a meniscus 79 at an interface between the capillary space 94' and the relief space 95. Thereafter, the melted precursor material 78 and other contents of the mold 40 are allowed to cool 100', whereupon the relief space 95 serves to allow any necessary thermal expansion of the precursor material 78 from within the capillary space 94'. Cooling 100' of the melted preform allows the melted precursor to form columnar growth crystalline structures, thereby forming a semiconductor member 110. As discussed above, in embodiments in which the dopant layer 66 is provided 68 and placed 70 in the mold 40', at an interface 90 of the melted precursor 78 with the dopant layer 66, the dopant 66 diffuses and reacts with the precursor 78, resulting in a semiconductor member 110 which is rich in substances helpful in improving the performance of the semiconductor member 110.

As discussed above, in several embodiments, melting of the preform 80 is performed during a brief time interval, such as for example less than five minutes, so as to avoid excessive oxidation and other such contamination of the silicon forming the preform 80. However, it will be understood that the speed at which the preform 80 is melted and cooled through heating and cooling of the mold 40' is, at least in part dependent upon the size of the mold 40', and preform 80 disposed within, to be heated and cooled. More specifically, the greater the mass of mold materials and precursor material to be heated and cooled, the longer the time period required for exposure of the mold 40' and preform 80 to a constant-state heat source in order to accomplish melting of the preform 80, and the longer the time period required following removal of the mold 40' and preform 80 from the heat source until the semiconductor cools. However, it will be understood that a smaller mold 40' generally exhibits a smaller overall interior cavity, and thus results in a smaller resultant semiconductor. Thus, it will be understood that the general dimensions of the mold 40' may vary in order to generally maximize the size of the resultant semiconductor member while minimizing the energy necessary to accomplish melting 84' and cooling 100' of the mold 40' and preform 80. For example, in one embodiment, the mold 40' includes a generally square first plate 44', beveled circumferential lip 48', and second plate 92', each having a square geometry and defining a thickness of between approximately 5-25 millimeters. In this embodiment the interior surface 46' of the first plate 44' defines a dimension of approximately 156 millimeters square, and the capillary space 94' defined by the interior 42 of the mold 40' is approximately 160 microns thick. In this embodiment, it has been found that the above-discussed inductive coils 108 are capable of heating and melting the mold 40' to a temperature of approximately 1435 degrees Centigrade in approximately 10 seconds. In a more discreet embodiment, each of the first plate 44', beveled circumferential lip 48', and second plate 92', defines a thickness of approximately 10 millimeters.

It will be understood that, in several applications for using the semiconductor member 110 produced through the method invention 10, the semiconductor member 110 must be capable of being removed from the mold 40. Accordingly, in certain embodiments, at least one delaminating layer is provided within the combined mold 40' and second plate 92' prior to melting 84' of the preform 80 to assist in removal of at least one of the second plate 92' and the mold 40' from the finished semiconductor member 110. For example, in certain embodiments in which the interlayer 60 is optionally provided 54, the interlayer 60 serves to enable delamination of at least one of the second plate 92' and the mold 40' from the finished semiconductor member 110. In certain other embodiments in which the various components of the mold 40' are coated with a ceramic material 102, the ceramic material 102 serves to enable delamination of at least one of the second plate 92' and the mold 40' from the finished semiconductor. However, it will be understood that additional delaminating layers may be provided without departing from the spirit and scope of the present invention.

Figure 12:
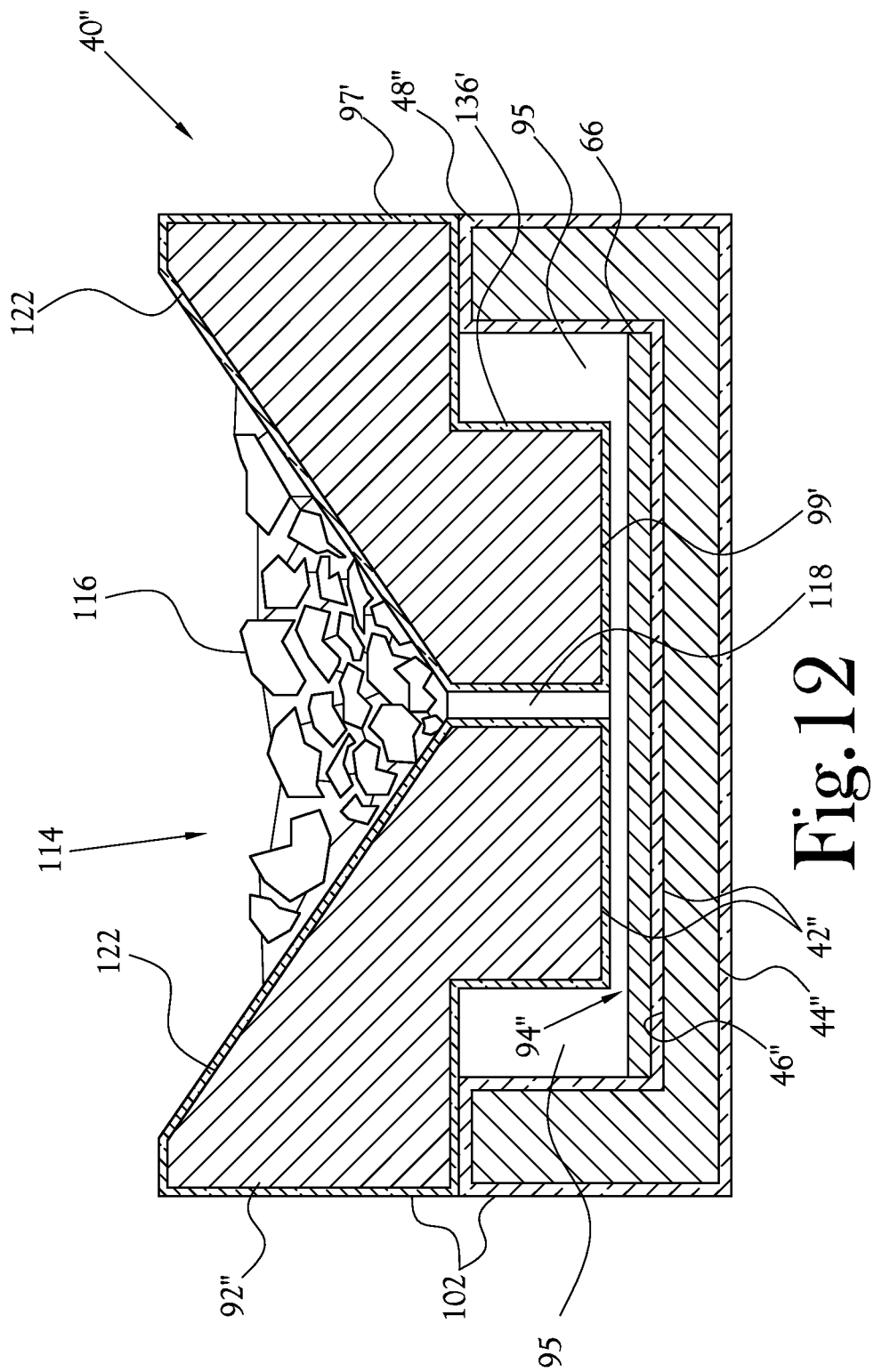
FIG. 12 is a cross-sectional view of a mold containing various components useful in performing another embodiment of the method of producing a semiconductor.
Figure 13:
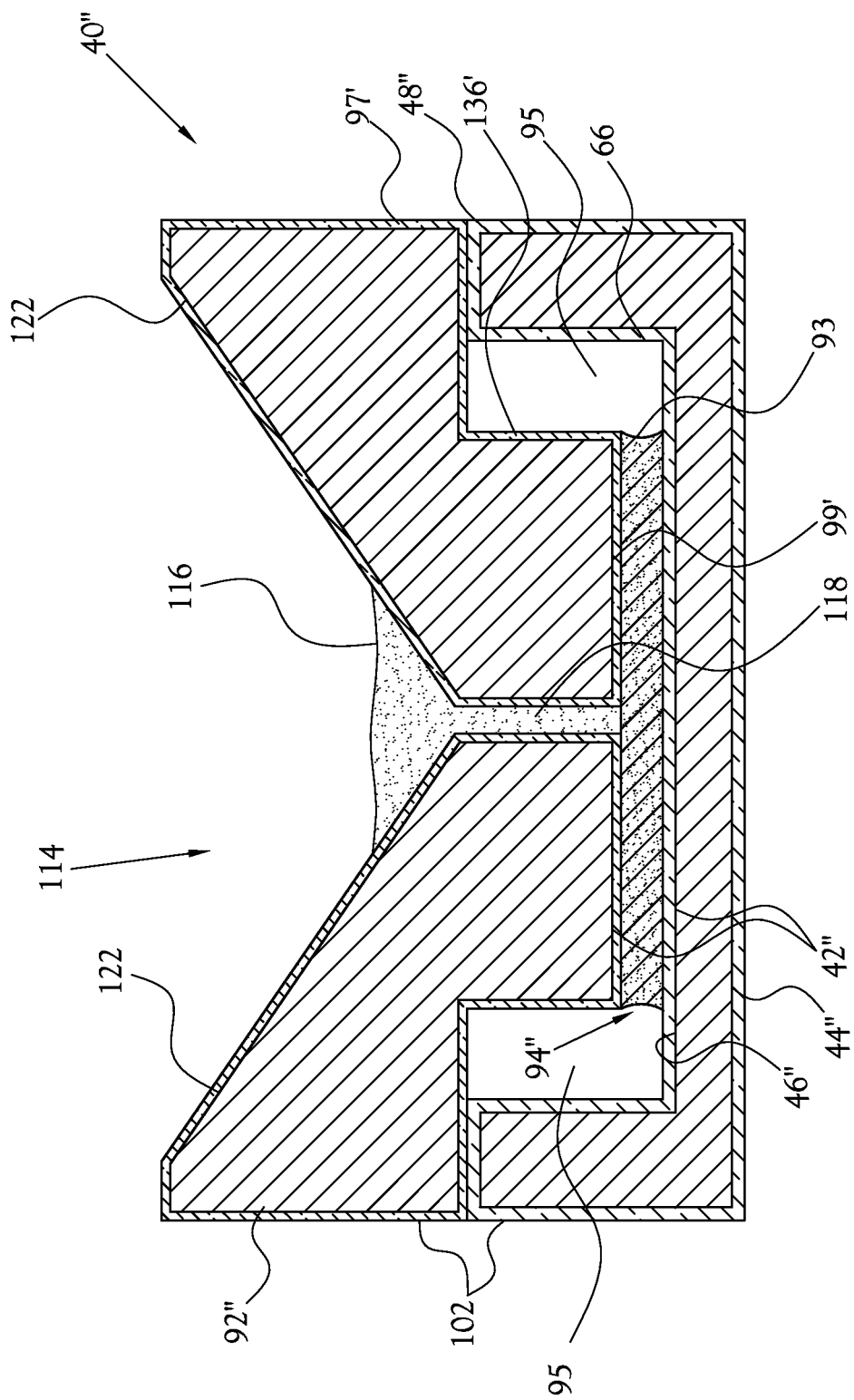
FIG. 13 is a cross-sectional view of the mold of FIG. 12 containing the finished semiconductor following heating and cooling of the mold components.

FIGS. 12 and 13 illustrate a cross-sectional view of another mold 40" which is used in another embodiment of the method of the present invention. In this embodiment, the mold 40" defines generally a vessel 114 for holding a measure of precursor material 116 and an inlet 118 for introducing melted precursor material 78 into the capillary space 94" defined by the mold 40". Thus, in this embodiment, the operation of placing precursor within the capillary space 94" occurs simultaneously, or near simultaneously, to the operation of melting the precursor.

Similarly to the previous embodiment of the mold 40' discussed above, the mold 40" as shown in FIGS. 12 and 13 defines a set of interior surfaces 42" conforming generally to the shape of the desired finished semiconductor member and includes a bottom plate 44" which defines an upper surface 46" conforming to an interior bottom surface of the desired mold 40". A circumferential lip 48" is integrally formed along the perimeter of the upper surface 46" of the plate 44" and extends generally upwardly and outwardly from the plate 44", such that the lip 48" cooperates with the plate 44" to prevent loss of the various raw components of the finished semiconductor from the interior 42" of the mold 40". A cap 92" is provided in a parallel, spaced apart relationship to the plate 44" to establish a capillary space 94" between the plate 44" and the cap 92". In the illustrated embodiment, the cap 92" includes a rectangular first portion 136' having a lower surface 99' configured to be positioned in a parallel-planar, offset relationship to the upper surface 46" of the plate 44" to define the capillary space 94". A circumferential flange 97' extends horizontally from an upper portion of the first portion 136' and is sized to rest along the circumferential lip 48" to position the first portion lower surface 99' within the mold 40" to define the capillary space 94". In the illustrated embodiment, the first portion 136' of the cap 92 is sized slightly smaller than the space defined within the circumferential lip 48" such that a relief space 95' is defined between the lip 48" and the first portion 136' as discussed above. At least the interior surfaces 42" of the mold 40", and preferably all surfaces of the mold 40", including the cap 92", are coated with a ceramic material 102 which is substantially non-reactive to silicon powder as discussed above.

In the illustrated embodiment, the cap 92" defines a vessel 114 for holding a measure of precursor material 116. More specifically, the cap 92" defines a plurality upwardly and outwardly sloping beveled walls 122 along an upper surface thereof to define the vessel 114 therebetween. A central portion of the cap 92" defines an inlet 118 in the form of a through opening providing fluid communication between the vessel 114 and the capillary space 94" defined between the first plate 44" and the cap 92" of the mold 40". The inlet 118 is sized to allow the flow of melted precursor material from the vessel 114 into the capillary space 94". In one embodiment, the inlet 118 is sized to allow the flow of melted precursor material from the vessel 114 into the capillary space 94", while limiting the entry of unmelted precursor material into the capillary space 94".

As discussed above, following provision of the mold 40" as discussed above, an interlayer 60 is optionally provided and placed in the mold 40" to create a forgiving layer to allow thermal expansion and contraction of semiconductor materials along the interior of the mold 40" and a delaminating layer to assist in removal of at least one of the cap 92" and the mold 40" from the finished semiconductor member. The dopant layer 66 is optionally provided and placed in the mold 40" along the interlayer 60 opposite the first plate 44" of the mold 40". In separate operations, a measure of precursor material 116 is placed in the vessel 114 defined by the cap 92", and the cap 92" is placed over the interior 42" of the mold 40" to define the capillary space 94".

In several embodiments, assembly of the various raw components of the semiconductor takes place within a cover atmosphere as discussed above. Thereafter, the precursor material 116 within the vessel 114 is melted within the cover atmosphere. Upon melting of the precursor material 116 within the vessel 114, melted precursor material 120 is allowed to flow through the inlet 118 and into the capillary space 94", whereupon the melted precursor material 78 wicks throughout the capillary space 94" to substantially fill the capillary space 94" adjacent the cap 92". In the illustrated embodiment, the melted precursor material 78 forms a meniscus 79 at an interface of the capillary space 94" with the relief space 95, such that the relief space 95 allows for thermal expansion of the precursor material 78 upon cooling 100 as discussed above. Thereafter, the melted precursor material 78 and other contents of the mold 40 are allowed to cool 100 and to form a semiconductor member 110. As discussed above, at an interface 90 of the melted precursor material 78 with the dopant layer 66, the dopant 66 diffuses and reacts with the precursor material 78, resulting in a boundary 93 between the interlayer 60 and the melted precursor material 78 which is rich in substances helpful in improving the performance of a semiconductor.

It will be understood that, with certain precursor materials 78, the above-discussed cooling of the melted precursor material 78 to form the semiconductor member 110 can result in slight thermal expansion of the precursor material within the mold 40. To accommodate such thermal expansion upon cooling 100, in the illustrated embodiment discussed above, the mold 40' defines suitable relief spaces 95 adjacent and in fluid connection with the capillary space 94' to permit such thermal expansion and contraction. In another embodiment, the melted precursor material 78 is permitted to wick only partially into the capillary space 94' prior to cooling 100, such that sufficient unfilled space remains within the capillary space 94 to accommodate thermal expansion of the precursor material upon cooling 100. In yet another embodiment, the mold 40 and defined capillary space 94 is of a geometry such that the meniscus 79 formed by the precursor material 78 provides sufficient space within the mold 40 to allow the melted precursor material 78 to expand upon cooling 100.

It will be generally understood that the above-discussed operations of reducing essentially pure lump precursor material into precursor material in the presence of a liquid cover can result in unintentional exposure of the precursor material to impurities, thereby reducing the overall performance of the resultant semiconductor as discussed above. Thus, in certain embodiments using the cap 92" including the vessel 114 and inlet 118 as shown in FIGS. 11 and 12, melted precursor material 78 is introduced into the capillary space 94" of the mold 40" absent the operation of providing precursor powder in a slurry 12. To this extent, in one embodiment, the precursor material 116 provided in the vessel 114 is granular precursor material. In another embodiment, the precursor material 116 provided in the vessel 114 is lump precursor material. In yet another embodiment, the precursor material 116 provided in the vessel 114 is a single, unitary piece of essentially pure precursor material. However, regardless of the initial grain size of the precursor material 116 provided, use of the cap 92" including the vessel 114 and inlet 118 as shown in FIGS. 12 and 13, allows melted precursor material 78 to be introduced into the capillary space 94" of the mold 40" to substantially fill and conform to the capillary space 94".

From the foregoing description, it will be recognized by those skilled in the art that an efficient and cost-effective method of producing a semiconductor has been provided. The method of producing a semiconductor allows for the production of a semiconductor member with reduced waste of semiconductor precursor feedstock as compared with certain prior art methods. Use of the radiant energy source, or alternatively the inductive heater, as described hereinabove in the method of producing a semiconductor allows for melting and crystallization of the precursor powder to form the semiconductor member more quickly than certain prior art methods described hereinabove. Furthermore, the method of producing a semiconductor allows for the production of a semiconductor material having increased purity as compared to certain prior art methods described hereinabove.

Some advantages offered by the above-discussed method include: (1) higher packing density for melting without harmful impurities; (2) quicker heating, thus resulting in less contamination by oxidation; (3) higher efficiency and yield due to shorter side-to-side path; (4) higher yield from as low as 30% to as high as 98% due to (a) less contamination by oxidation, (b) less trimming, and (c) elimination of sawing; (5) higher yield and efficiency due to the processing ability to make net shape thin wafers typically as thin as 20-50 microns, as well as thicker wafers as currently used in the range of 160-800 microns; and (6) larger wafers due to relatively unrestricted processing with regard to size, thus enabling much higher aerial yield. For instance, current technology is limited to producing a solar grade semiconductor wafer having a length of approximately 15 centimeters and a width of approximately 15 centimeters (approximately 225 $cm^2$). The present invention enables manufacture of a solar grade semiconductor wafer having a length of approximately one meter and a width of approximately one meter (approximately 1.0 $m^2$), thereby reducing or eliminating the wafer-to-wafer space losses in a finished solar cell.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

What is claimed is:

1. A method of forming a tool for use in manufacturing a semiconductor wafer, said method comprising the steps of:
providing a graphite member defining a planar capillary space conforming generally to the shape of a finished semiconductor wafer, wherein said operation of providing the graphite member includes providing a mold comprising a plurality of members cooperating to define a set of interior surfaces conforming generally to the shape of a finished semiconductor wafer, wherein said operation of providing the graphite member further includes providing a first member defining a first interior surface conforming to an interior bottom surface of the mold, and a second member defining a second interior surface conforming to an interior upper surface of the mold, wherein said first and second members are shaped for mateable engagement with one another to hold the first and second interior surfaces in parallel-planar, spaced apart relationship with one another to establish the planar capillary space, wherein said provided first and second members are shaped for mateable engagement with one another to hold the first and second interior surfaces in parallel-planar relationship with one another and spaced apart from one another a distance of less than or equal to approximately 400 microns;
providing a measure of finely divided silicon nitride containing less than 2% silica, oxygen, and silicon;
mixing the silicon nitride with colloidal silica;
coating the graphite member with the silicon nitride and colloidal silica mixture; and
heating the coating in the presence of nitrogen to a temperature in excess of 1,400 degrees Centigrade to form a silicon nitride covering on the graphite member.

2. The method of claim 1, wherein said provided first and second members are shaped for mateable engagement with one another to hold the first and second interior surfaces in parallel-planar relationship with one another and spaced apart from one another a distance of less than or equal to approximately 200 microns.

3. The method of claim 1, wherein said provided first member defines a circumferential lip extending upwardly along a perimeter of the first interior surface, and wherein said first interior surface and said circumferential lip cooperate to define a first vessel.

4. The method of claim 3, wherein said provided second member defines a rectangular first portion having a lower surface defining the second interior surface and a circumferential flange extending horizontally from an upper portion of the rectangular first portion, and wherein the flange is sized to rest along the circumferential lip of the first member to position the second interior surface within the first vessel to define the capillary space.

5. The method of claim 4, wherein said provided second member further defines a second vessel along an upper surface thereof.

6. The method of claim 4, wherein said provided second member further defines a plurality of upwardly and outwardly sloping beveled walls along an upper surface thereof, each of the upwardly and outwardly sloping beveled walls cooperating to define a second vessel for holding a measure of precursor material.

7. The method of claim 6, wherein said provided second member further defines an inlet in the form of a through opening in fluid communication between the second vessel and the planar capillary space.

8. The method of claim 7, wherein said operation of providing the first and second members includes forming the first and second members.

\* \* \* \* \*